United States Patent
Hibi et al.

(10) Patent No.: US 6,204,128 B1
(45) Date of Patent: Mar. 20, 2001

(54) METHOD FOR FABRICATING SEMICONDUCTOR DEVICE

(75) Inventors: Toshitaka Hibi, Kyoto; Kazuo Hayama, Osaka, both of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/383,418

(22) Filed: Aug. 26, 1999

(30) Foreign Application Priority Data

Oct. 26, 1998 (JP) .................................................. 10-303911

(51) Int. Cl.⁷ .......................... H01L 21/336; H01L 21/20
(52) U.S. Cl. .......................... 438/270; 438/272; 438/289; 438/389
(58) Field of Search .................................. 438/270, 274, 438/272, 289, 290, 291, 389

(56) References Cited

U.S. PATENT DOCUMENTS

| | | | |
|---|---|---|---|
| 4,455,740 | * 6/1984 | Iwai | 29/571 |
| 5,017,504 | * 5/1991 | Nishimura et al. | 437/40 |
| 5,270,257 | * 12/1993 | Shin | 437/203 |
| 5,387,528 | * 2/1995 | Hutchings et al. | 437/40 |
| 5,429,977 | * 7/1995 | Lu et al. | 437/47 |
| 5,538,913 | * 7/1996 | Hong | 437/44 |
| 5,587,340 | * 12/1996 | Yamazaki | 437/203 |
| 5,937,297 | * 8/1999 | Peidous | 438/270 |
| 5,972,754 | * 10/1999 | Ni et al. | 438/270 |

FOREIGN PATENT DOCUMENTS

| | | |
|---|---|---|
| 63-211762 | 9/1988 | (JP) . |
| 2-303166 | 12/1990 | (JP) . |
| 4-056279 | 2/1992 | (JP) . |
| 4-259258 | 9/1992 | (JP) . |
| 5-190565 | 7/1993 | (JP) . |

* cited by examiner

Primary Examiner—Matthew Smith
Assistant Examiner—Lex H. Malsawma
(74) Attorney, Agent, or Firm—Eric J. Robinson; Nixon Peabody LLP

(57) ABSTRACT

A method for fabricating a semiconductor device includes the steps of: forming a doped layer of a first conductivity type within a surface region of a semiconductor substrate; forming a recess by depositing an insulating film on the semiconductor substrate and then removing at least the insulating film in a region thereof where a gate electrode is to be formed; forming a gate insulating film on the surface of the semiconductor substrate, which is exposed inside the recess; and forming the gate electrode by filling in the recess with a conductive film.

11 Claims, 23 Drawing Sheets

US 6,204,128 B1

METHOD FOR FABRICATING SEMICONDUCTOR DEVICE

BACKGROUND OF THE INVENTION

The present invention relates to a method for fabricating a semiconductor device with an MOS structure.

In recent years, as the number of semiconductor devices integrated on a single chip has been tremendously increased, respective components of each semiconductor device have been drastically downsized. On the other hand, semiconductor devices are increasingly required to operate at an even higher speed and to demonstrate further improved reliability.

A semiconductor device with an MOS structure has heretofore been used for various type of electronic units and is also expected to find broader and broader applications from now on.

Hereinafter, a conventional method for fabricating a semiconductor device, more particularly a method for forming a gate electrode for an MOS transistor, will be described with reference to FIGS. 23(a) and 23(b).

First, as shown in FIG. 23(a), a field oxide film 12 is formed by a LOCOS technique so as to surround a transistor-forming region 11 on a silicon substrate 10. Thereafter, the surface of the silicon substrate 10 is thermally oxidized, thereby forming a silicon dioxide film 13 on the surface of the silicon substrate 10. Next, a doped polysilicon film (not shown) is deposited by a CVD process over the entire surface of the silicon substrate 10, and then a resist pattern (not shown, either) is defined on the polysilicon film. Subsequently, using the resist pattern as a mask, the polysilicon film is etched to form a gate electrode 14. And source/drain regions 15, 16 are formed.

Then, as shown in FIG. 23(b), exposed portions of the silicon dioxide film 13, which are located on right- and left-hand sides of the gate electrode 14, are removed, thereby forming a gate insulating film 17. Thereafter, an insulating film 18 is deposited over the entire surface of the silicon substrate 10 and planarized. Next, contact holes 19, 20 and 21 are formed in the insulating film 18 to reach the gate electrode 14, source region 15 and drain region 16, respectively. Then, a conductive material is deposited to fill in these contact holes 19, 20 and 21 and to slightly protrude upward therefrom. In this manner, electrode layers 22, 23 and 24 are formed so as to be interconnected to the gate electrode 14, source region 15 and drain region 16, respectively.

As can be seen, according to the conventional method for fabricating a semiconductor device, when the gate electrode 14 is formed by etching a conductive film (i.e., the polysilicon film), the silicon dioxide film 13 is used as an etch stopper.

However, the larger the number of semiconductor devices integrated is, the thinner the gate insulating film of an MOS transistor tends to be. Thus, according to the conventional method, i.e., if a gate electrode is formed by patterning a conductive film using an insulating film to be a gate insulating film as an etch stopper, not only the conductive film to be etched away, but also the gate insulating film are removed unintentionally. As a result, the reliability of the gate insulating film deteriorates.

To make a semiconductor device with an MOS structure operate at a higher speed, the thickness of a gate electrode should be increased such that the gate electrode has its resistance reduced. However, if the thickness of the gate electrode is increased, i.e., if the aspect ratio of the gate electrode (which is a ratio of the thickness of the gate electrode to the width thereof) is increased, then the conductive film should be etched to a greater depth. Accordingly, it is more difficult to end the etching process exactly at the upper surface of the insulating film to be the gate insulating film. Stated otherwise, if the gate insulating film should be thin, then the aspect ratio of the gate electrode cannot be large and the resistance of the gate electrode cannot be sufficiently reduced. Nevertheless, when the aspect ratio of the gate electrode is set high, the aspect ratio of a contact hole, which is used to interconnect a doped layer formed within a semiconductor substrate, i.e., source/drain region, to an interconnection layer, should also be high. In such a situation, the process steps of forming the contact hole and filling in the contact hole with a conductive material cannot be performed just as originally designed, thus decreasing the reliability of the semiconductor device.

SUMMARY OF THE INVENTION

An object of the present invention is providing a method for fabricating a semiconductor device, by which the thickness of a gate insulating film can be reduced without sacrificing the reliability thereof and a gate electrode can be formed at a high aspect ratio.

To achieve this object, a method for fabricating a semiconductor device according to the present invention includes the steps of: a) forming a doped layer of a first conductivity type within a surface region of a semiconductor substrate; b) forming a recess by depositing an insulating film on the semiconductor substrate and then removing at least the insulating film in a region thereof where a gate electrode is to be formed; c) forming a gate insulating film on the surface of the semiconductor substrate, which is exposed inside the recess; and d) forming the gate electrode by filling in the recess with a conductive film.

According to the method of the present invention, after a gate insulating film has been formed on the surface of a semiconductor substrate, which is exposed inside a recess provided on the semiconductor substrate, a gate electrode is formed by filling in the recess with a conductive film. That is to say, since the gate electrode can be formed without using the gate insulating film as an etch stopper, it is possible to prevent the gate insulating film from being damaged during the formation of the gate electrode. Accordingly, the thickness of the gate insulating film can be reduced without sacrificing the reliability thereof, and the gate electrode can be formed at a high aspect ratio even when the thickness of the gate insulating film is reduced.

In one embodiment of the present invention, the method preferably further includes, between the steps b) and c), the step of e) forming a doped layer of a second conductivity type in a region under the bottom of the recess such that the doped layer of the first conductivity type is divided into two by the doped layer of the second conductivity type.

In such an embodiment, source/drain regions are formed out of the doped layer of the first conductivity type, which has been divided into two by the doped layer of the second conductivity type. Accordingly, the formation of a channel can be controlled by applying a voltage to the gate electrode to be formed over the doped layer of the second conductivity type, thus improving the reliability of the semiconductor device.

In another embodiment of the present invention, the step d) preferably includes the steps of: depositing the conductive film over the insulating film, as well as inside the recess; and removing portions of the conductive film that have been deposited on the insulating film, thereby forming the gate electrode such that the upper surfaces of the gate electrode and the insulating film are substantially flush with each other and planarized.

In such an embodiment, the upper surface of the insulating film, which will be an underlying layer in a subsequent process step, can be planarized when the gate electrode is formed. Accordingly, upper-level interconnects or devices can be formed on the insulating film, as well as on the gate electrode, without newly performing a planarization process step. Thus, a multilevel structure can be formed for the semiconductor device more easily.

In still another embodiment, the step b) preferably includes the step of forming the recess such that the bottom of the recess is located within the doped layer of the first conductivity type. The method preferably further includes, between the steps b) and c), the step of e) forming a doped layer of a second conductivity type in a region under the bottom of the recess such that the doped layer of the first conductivity type is divided into two by the doped layer of the second conductivity type.

In such an embodiment, since the bottom of the gate electrode can be located under the surface of the semiconductor substrate, the aspect ratio of a source/drain contact hole can be lower compared to forming the entire gate electrode above the surface of the semiconductor substrate. Accordingly, the respective process steps of forming the source/drain contact hole and filling in the contact hole with the conductive material can be performed more exactly, thus improving the reliability of the semiconductor device. In addition, source/drain regions are formed out of the doped layer of the first conductivity type, which has been divided into two by the doped layer of the second conductivity type. Accordingly, the formation of a channel can be controlled by applying a voltage to the gate electrode to be formed over the doped layer of the second conductivity type, thus further improving the reliability of the semiconductor device.

In this particular embodiment where the recess is formed to have its bottom located within the doped layer of the first conductivity type, the method preferably further includes, between the steps b) and c), the step of f) forming an insulating sidewall on the wall of the recess.

In such an embodiment, the source/drain regions can be insulated from the gate electrode with more certainty, thus improving the reliability of the semiconductor device.

In this particular embodiment where the sidewall is formed, the method preferably further includes, between the steps b) and f), the step of g) forming a lightly-doped layer of the first conductivity type within the surface region of the semiconductor substrate inside the recess. A dopant concentration of the lightly-doped layer of the first conductivity type is lower than that of the doped layer of the first conductivity type. Preferably, the doped layer of the second conductivity type is formed between the steps f) and c) in a region under a part of the bottom of the recess, which is surrounded by the sidewall, so as to divide the lightly-doped layer of the first conductivity type into two.

In such an embodiment, the lightly-doped layer of the first conductivity type, which has been divided into two by the doped layer of the second conductivity type, is located between the source/drain regions and the doped layer of the second conductivity type. Accordingly, the intensity of an electric field, which is created by applying a voltage between the source/drain regions, can be reduced, thus improving the reliability of the semiconductor device.

In still another embodiment, the step b) preferably includes the step of forming the recess such that the bottom of the recess is located under the doped layer of the first conductivity type.

In such an embodiment, since the bottom of the gate electrode can be located under the surface of the semiconductor substrate, the aspect ratio of a source/drain contact hole can be lower compared to forming the entire gate electrode above the surface of the semiconductor substrate. Accordingly, the respective process steps of forming the source/drain contact hole and filling in the contact hole with the conductive material can be performed more exactly, thus improving the reliability of the semiconductor device. In addition, source/drain regions are formed out of the doped layer of the first conductivity type, which has been divided into two by the recess. Accordingly, the formation of a channel can be controlled by applying a voltage to the gate electrode to be formed within the recess, thus further improving the reliability of the semiconductor device.

In this particular embodiment where the recess is formed to have its bottom located under the doped layer of the first conductivity type, the method preferably further includes, between the steps b) and c), the step of f) forming an insulating sidewall on the wall of the recess.

In such an embodiment, the source/drain regions can be insulated from the gate electrode with more certainty, thus improving the reliability of the semiconductor device.

In this particular embodiment where the recess is formed to have its bottom located under the doped layer of the first conductivity type, the method preferably further includes, between the steps b) and c), the step of: h) forming a lightly-doped layer of the first conductivity type to be connected to the doped layer of the first conductivity type within the surface region of the semiconductor substrate inside the recess. A dopant concentration of the lightly-doped layer of the first conductivity type is lower than that of the doped layer of the first conductivity type. Preferably, the method further includes, between the steps b) and c), the step of i) forming a doped layer of the second conductivity type such that the lightly-doped layer of the first conductivity type is divided into two by the doped layer of the second conductivity type.

In such an embodiment, the lightly-doped layer of the first conductivity type, which has been divided into two by the doped layer of the second conductivity type, is located between the source/drain regions and the doped layer of the second conductivity type. Accordingly, the intensity of an electric field, which is created by applying a voltage between the source/drain regions, can be reduced, thus improving the reliability of the semiconductor device.

DESCRIPTION OF THE PREFERRED EMBODIMENTS

Embodiment 1

Hereinafter, a method for fabricating a semiconductor device according to a first embodiment of the present invention will be described with reference to FIGS. 1(a) through 1(c), 2(a) through 2(c), 3(a) through 3(c), 4(a) through 4(c) and 5(a) and 5(b).

Figure 1A:
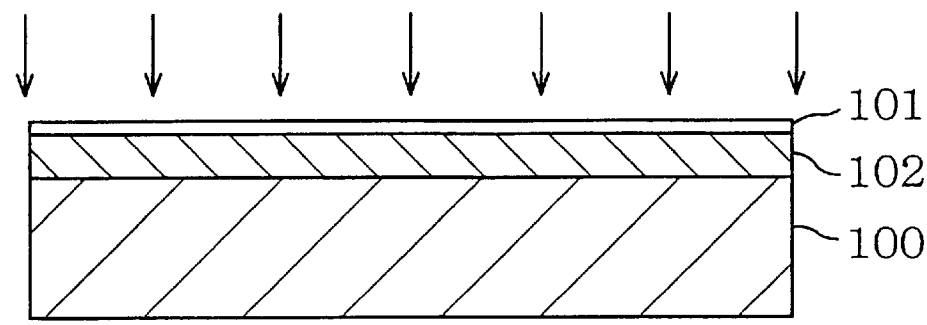
FIGS. 1(a) through 1(c) are cross-sectional views illustrating respective process steps for fabricating a semiconductor device according to a first embodiment of the present invention.

First, as shown in FIG. 1(a), a first insulating film 101 of silicon dioxide is formed on a p-type silicon substrate 100 by thermal oxidation, for example. Then, n-type dopant ions are implanted into the p-type silicon substrate 100 using the first insulating film 101 as a protective film, thereby forming an n-type doped layer 102 under the first insulating film 101 within the p-type silicon substrate 100.

Figure 1B:
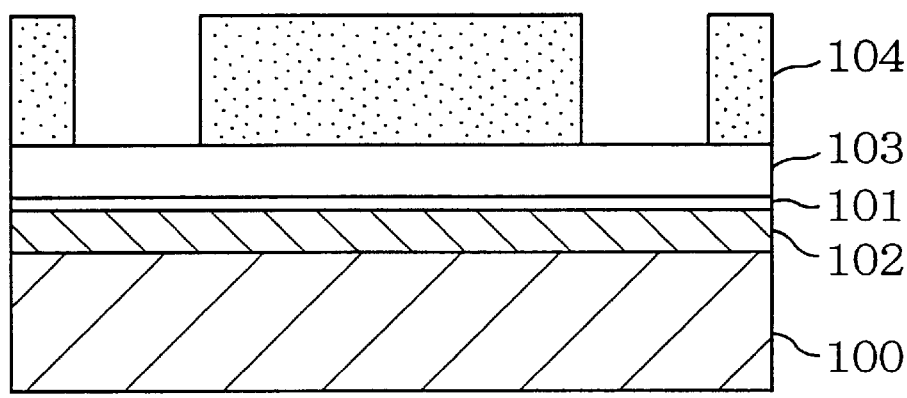

Next, as shown in FIG. 1(b), a second insulating film 103 of silicon nitride is deposited on the first insulating film 101 by a CVD process, for example. Then, a first resist pattern 104 is defined by photolithography on the second insulating film 103 to have a plurality of openings over respective regions where trench isolations are to be formed. In this process step, the second insulating film 103 needs to show etch selectivity with respect to the first insulating film 101.

Figure 1C:
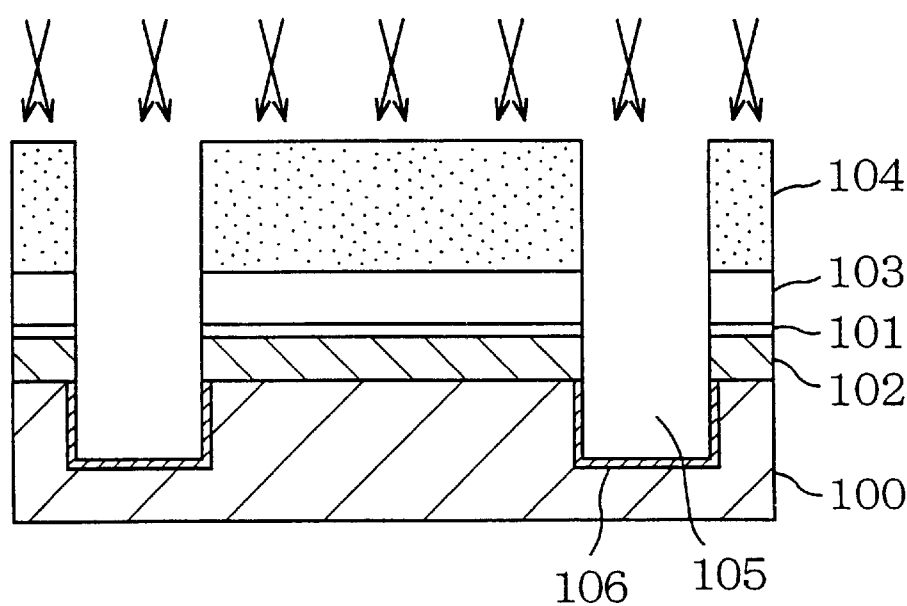

Subsequently, as shown in FIG. 1(c), the second insulating film 103, first insulating film 101 and p-type silicon substrate 100 are etched using the first resist pattern 104 as a mask, thereby forming trenches 105 within the p-type silicon substrate 100. Thereafter, p-type dopant ions are implanted into the p-type silicon substrate 100 using the first resist pattern 104 as a mask, thereby forming a first p-type doped layer 106 within the surface region of the p-type silicon substrate 100 inside the trenches 105.

Figure 2A:
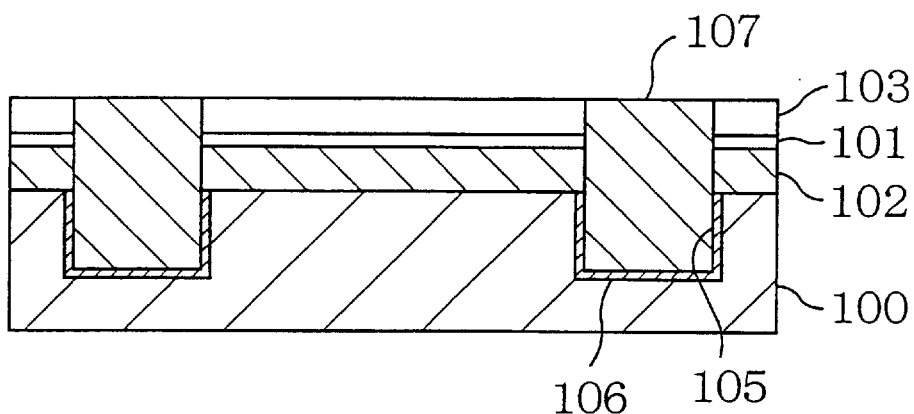
FIGS. 2(a) through 2(c) are cross-sectional views illustrating respective process steps for fabricating a semiconductor device according to the first embodiment.

Then, the first resist pattern 104 is removed. Thereafter, a silicon dioxide film is deposited by a CVD process, for example, over the entire surface of the second insulating film 103 as well as inside the trenches 105. And portions of the silicon dioxide film, which have been deposited on the second insulating film 103, are removed by a CMP technique, for example. In this manner, trench isolations 107 are formed such that the respective upper surfaces of the trench isolations 107 and the second insulating film 103 are substantially flush with each other and planarized as shown in FIG. 2(a).

Figure 2B:
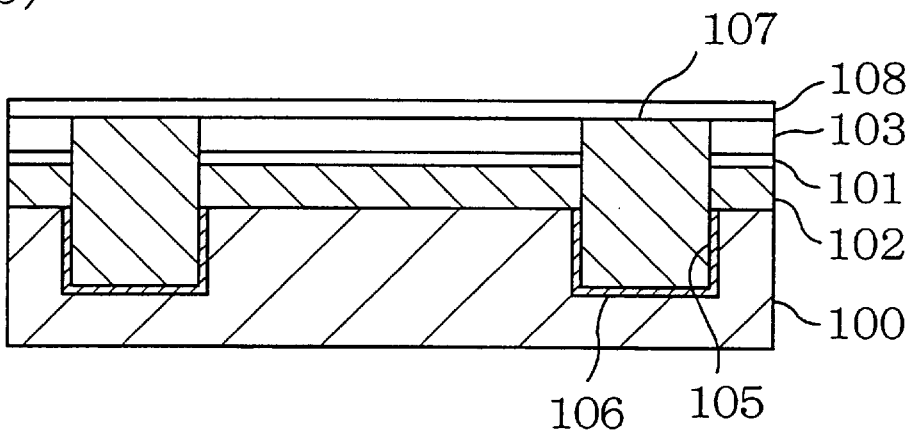

Next, as shown in FIG. 2(b), a third insulating film 108 of silicon nitride is deposited by a CVD process, for example, over the entire surface of the second insulating film 103 as well as over the trench isolations 107. In this process step, the third insulating film 108 needs to show etch selectivity with respect to the first insulating film 101.

Figure 2C:
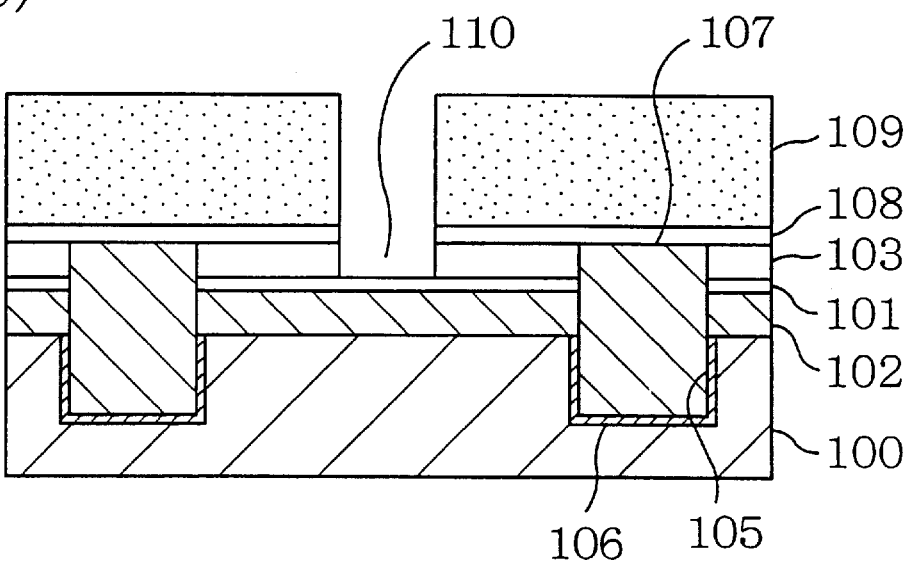

Subsequently, as shown in FIG. 2(c), a second resist pattern 109 is defined by photolithography on the third insulating film 108 to have an opening over a region where a gate electrode is to be formed. Thereafter, the third and second insulating films 108 and 103 are etched using the second resist pattern 109 as a mask, thereby forming a recess 110 within the third and second insulating films 108 and 103.

Figure 3A:
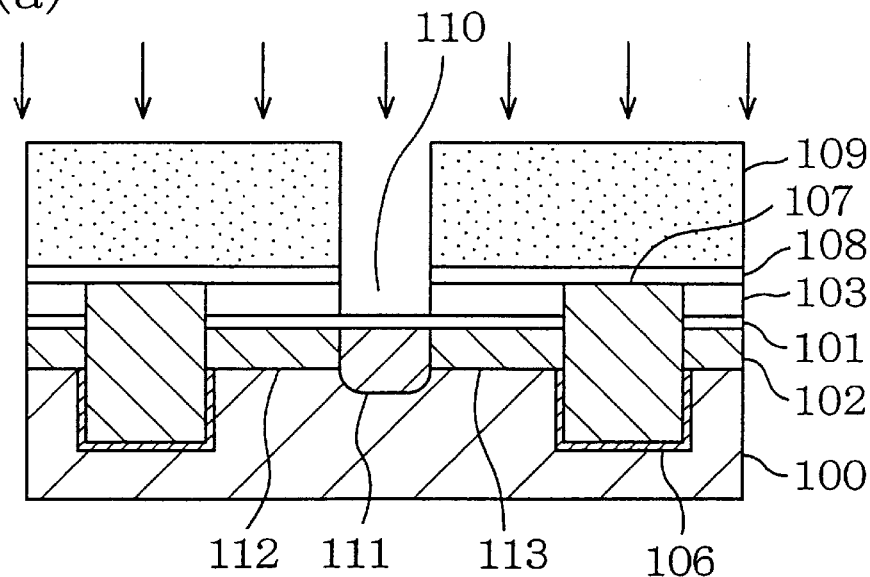
FIGS. 3(a) through 3(c) are cross-sectional views illustrating respective process steps for fabricating a semiconductor device according to the first embodiment.

Then, as shown in FIG. 3(a), p-type dopant ions are implanted into the p-type silicon substrate 100 using the second resist pattern 109 as a mask, thereby forming a second p-type doped layer 111 in a region under the bottom of the recess 110 so as to divide the n-type doped layer 102 into two. As a result, source/drain regions 112 and 113 are formed out of the n-type doped layer 102, which has been divided into two by the second p-type doped layer 111. In this case, if the second p-type doped layer 111 is formed such that the bottom of the layer 111 is located deeper than that of the n-type doped layer 102, then the threshold voltage of the resulting transistor can be high.

Figure 3B:
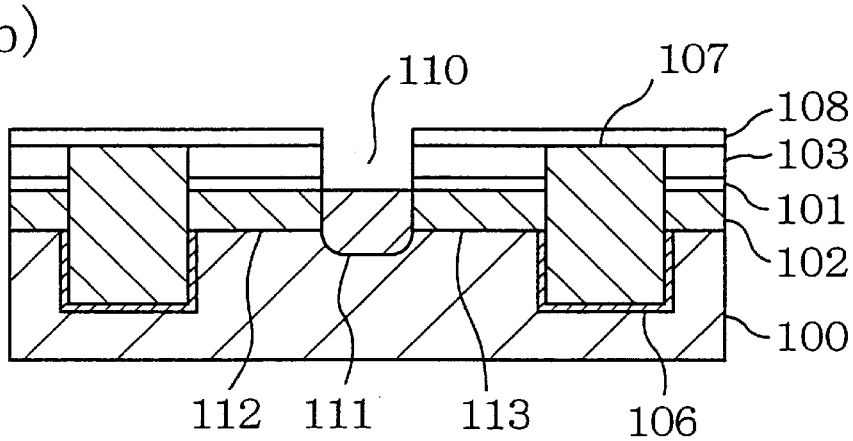

Thereafter, the second resist pattern 109 is removed. Then, portion of the first insulating film 101, which is located on the second p-type doped layer 111, is wet-etched using an aqueous solution containing buffered hydrofluoric acid, thereby exposing the second p-type doped layer 111 as shown in FIG. 3(b).

Figure 3C:
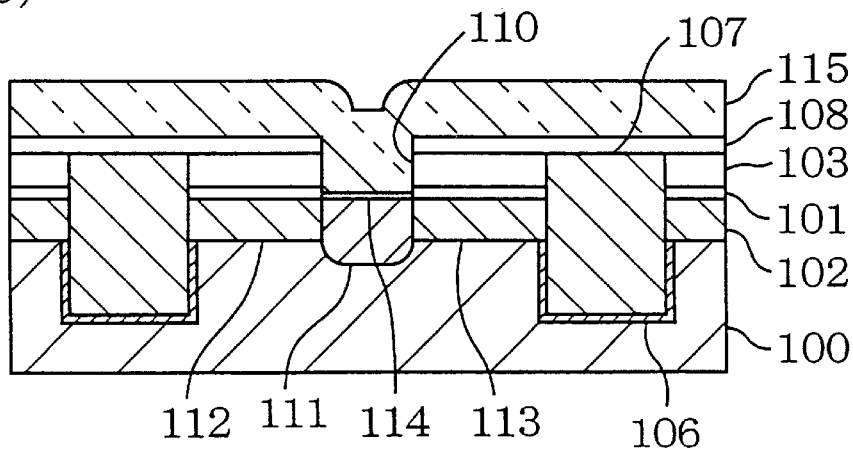

Next, as shown in FIG. 3(c), a gate insulating film 114 of silicon dioxide is formed on the second p-type doped layer 111 by thermal oxidation, for example. And a conductive film 115 of doped polysilicon, for example, is deposited over the entire surface of the third insulating film 108, as well as inside the recess 110.

Figure 4A:
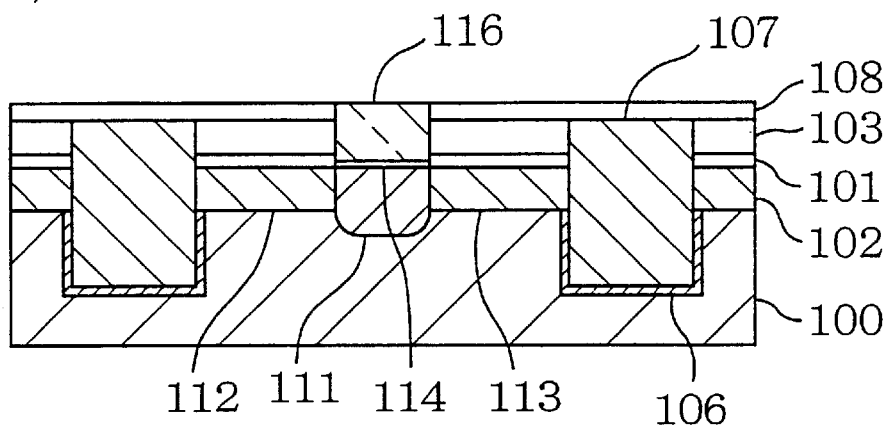
FIGS. 4(a) through 4(c) are cross-sectional views illustrating respective process steps for fabricating a semiconductor device according to the first embodiment.

Then, portions of the conductive film 115, which have been deposited on the third insulating film 108, are removed by a CMP technique, for example, thereby forming a gate electrode 116 such that the respective upper surfaces of the gate electrode 116 and the third insulating film 108 are substantially flush with each other and planarized as shown in FIG. 4(a).

Figure 4B:
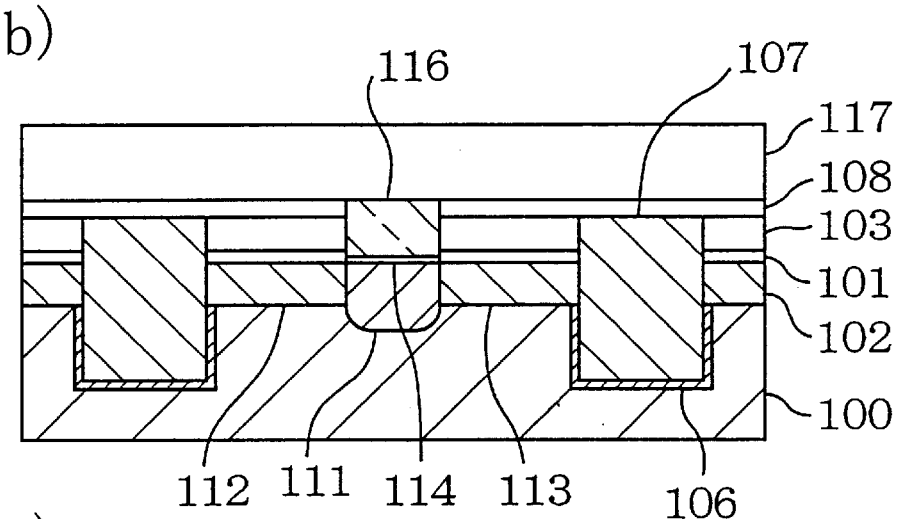

Subsequently, as shown in FIG. 4(b), a fourth insulating film 117 of silicon dioxide is deposited by a CVD process, for example, over the entire surface of the third insulating film 108 as well as over the gate electrode 116.

Figure 4C:
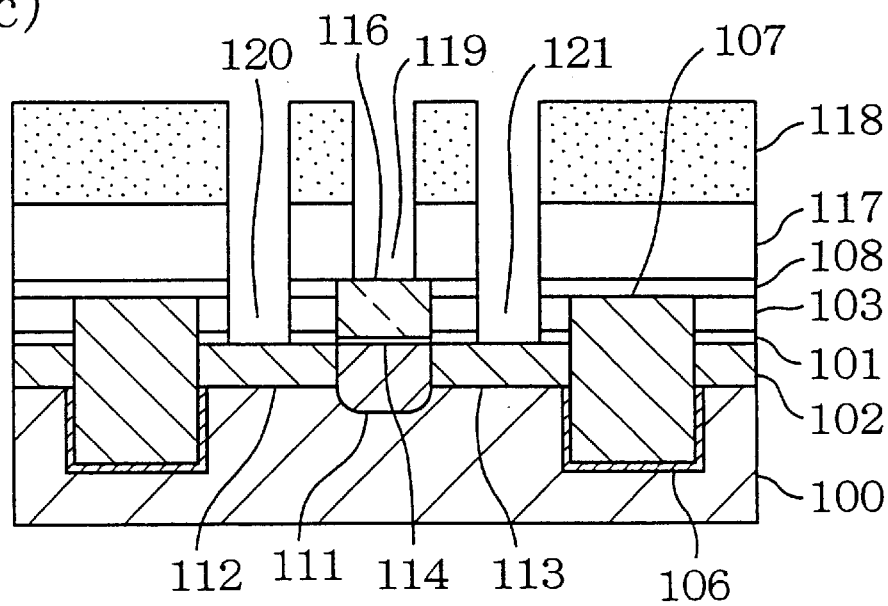

Thereafter, as shown in FIG. 4(c), a third resist pattern 118 is defined by photolithography on the fourth insulating film 117 so as to have a plurality of openings over respective regions where contact holes are to be formed. Then, using the third resist pattern 118 as a mask, the fourth, third, second and first insulating films 117, 108, 103 and 101 are etched, thereby forming contact holes 119, 120 and 121 for gate, source and drain, respectively. In this specification, these contact holes will be referred to as "gate contact hole", "source contact hole" and "drain contact hole" for the sake of simplicity.

Figure 5A:
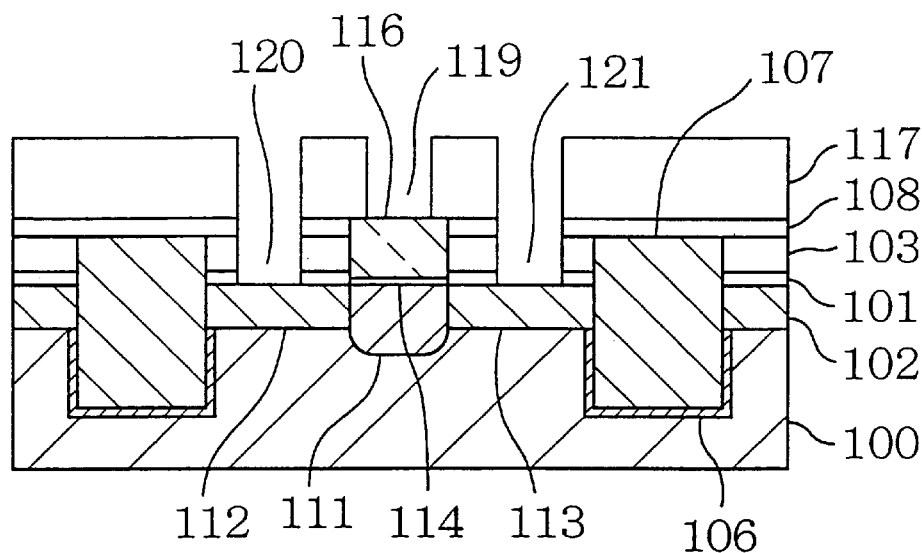
FIGS. 5(a) and 5(b) are cross-sectional views illustrating respective process steps for fabricating a semiconductor device according to the first embodiment.

Next, as shown in FIG. 5(a), the third resist pattern 118 is removed.

Figure 5B:
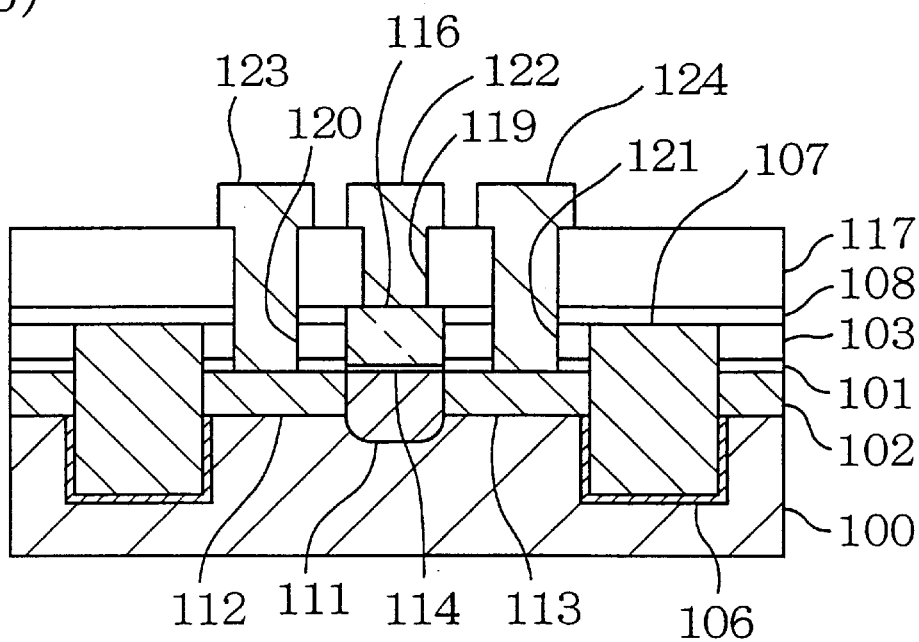

Finally, as shown in FIG. 5(b), metal interconnection layers 122, 123 and 124 are formed by stacking titanium nitride, aluminum, tungsten, titanium nitride and titanium films, for example, to fill in the gate, source and drain contact holes 119, 120 and 121 and to slightly protrude upward therefrom. The metal interconnection layers 122, 123 and 124 will be used as extension electrodes.

According to the first embodiment, the gate insulating film 114 is formed on the surface of the p-type silicon substrate 100, which is exposed inside the recess 110 provided on the p-type silicon substrate 100. Then, the gate electrode 116 is formed by filling in the recess 110 with the conductive film 115. That is to say, since the gate electrode 116 can be formed without using the gate insulating film 114 as an etch stopper, it is possible to prevent the gate insulating film 114 from being damaged during the formation of the gate electrode 116. Accordingly, the thickness of the gate insulating film 114 can be reduced without sacrificing the reliability of the gate insulating film 114, and therefore, the number of semiconductor devices integrated can be increased. In addition, even when the gate insulating film 114 is thinned, the gate electrode 116 can be formed at a high aspect ratio, and the resistance of the gate electrode 116 can be reduced. Consequently, the semiconductor device can operate at a higher speed.

Also, according to the first embodiment, the second p-type doped layer 111 is formed in a region under the bottom of the recess 110 in such a manner as to divide the n-type doped layer 102 into two. Thus, the source/drain regions 112 and 113 are formed out of the n-type doped layer 102, which has been divided into two by the second p-type doped layer 111. Accordingly, the formation of a channel can be controlled by applying a voltage to the gate electrode 116 to be formed over the second p-type doped layer 111, thus improving the reliability of the semiconductor device.

In addition, according to the first embodiment, the conductive film 115 is deposited over the entire surface of the third insulating film 108, as well as inside the recess 110. Thereafter, portions of the conductive film 115 that have been deposited on the third insulating film 108 are removed, thereby forming the gate electrode 116 such that the respective upper surfaces of the gate electrode 116 and the third insulating film 108 are substantially flush with each other and planarized. Thus, the upper surface of the third insulating film 108, which will be an underlying layer in a subsequent process step, can be planarized when the gate electrode 116 is formed. Accordingly, upper-level interconnects or devices can be formed on the third insulating film 108, as well as on the gate electrode 116, without newly performing a planarization process step. As a result, a multilevel structure can be formed for the semiconductor device more easily.

Moreover, according to the first embodiment, the second and third insulating films 103 and 108 both show etch selectivity with respect to the first insulating film 101. Thus, when the first insulating film 101 is etched, neither the second insulating film 103 nor third insulating film 108 is removed, and therefore, the recess 110 is not damaged. As a result, the gate electrode 116 can be formed exactly at its desired size, thus improving the reliability of the semiconductor device.

In the first embodiment, the conductive film 115 is made of doped polysilicon. Alternatively, the conductive film 115 may be a single-layer film of tungsten, molybdenum, titanium, platinum, copper, tungsten silicide, molybdenum silicide, titanium silicide or platinum silicide, or a multilayer film consisting of a doped polysilicon film and a tungsten silicide, molybdenum silicide, titanium silicide or platinum silicide film.

Also, in the first embodiment, an n-channel MOS transistor is formed using the p-type silicon substrate 100. However, the same effects are attainable if a p-channel MOS transistor is formed using an n-type silicon substrate instead.

Embodiment 2

Hereinafter, a method for fabricating a semiconductor device according to a second embodiment of the present invention will be described with reference to FIGS. 6(a) through 6(c), 7(a) through 7(c), 8(a) through 8(c), 9(a) through 9(c), 10(a) through 10(c) and 11(a) through 11(c).

Figure 6A:
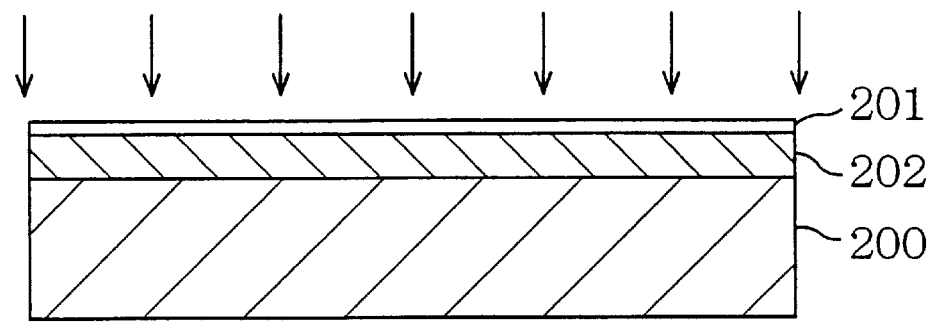
FIGS. 6(a) through 6(c) are cross-sectional views illustrating respective process steps for fabricating a semiconductor device according to a second embodiment of the present invention.

First, as shown in FIG. 6(a), a first insulating film 201 of silicon dioxide is formed on a p-type silicon substrate 200 by thermal oxidation, for example. Then, n-type dopant ions are implanted into the p-type silicon substrate 200 using the first insulating film 201 as a protective film, thereby forming an n-type doped layer 202 under the first insulating film 201 within the p-type silicon substrate 200.

Figure 6B:
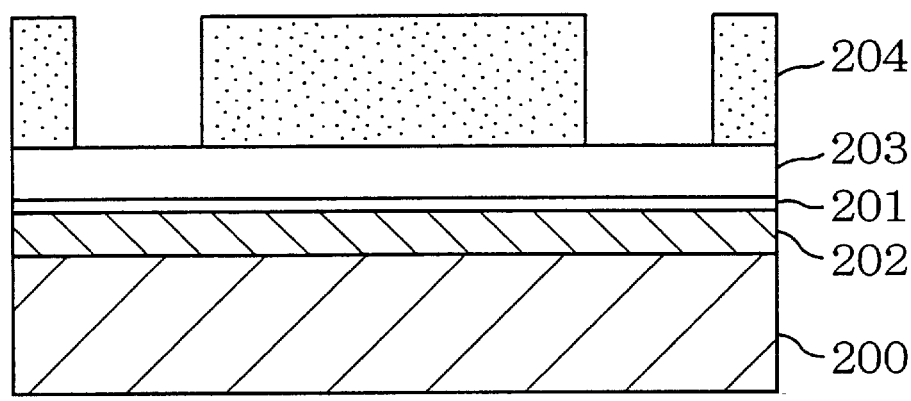

Next, as shown in FIG. 6(b), a second insulating film 203 of silicon nitride is deposited on the first insulating film 201 by a CVD process, for example. Then, a first resist pattern 204 is defined by photolithography on the second insulating film 203 to have a plurality of openings over respective regions where trench isolations are to be formed.

Figure 6C:
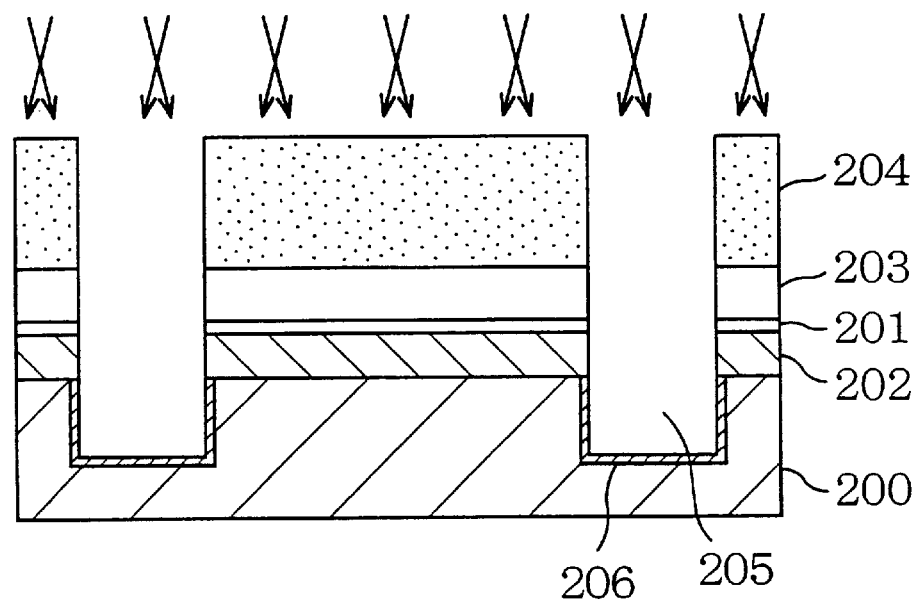

Subsequently, as shown in FIG. 6(c), the second insulating film 203, first insulating film 201 and p-type silicon substrate 200 are etched using the first resist pattern 204 as a mask, thereby forming trenches 205 within the p-type silicon substrate 200. Thereafter, p-type dopant ions are implanted into the p-type silicon substrate 200 using the first resist pattern 204 as a mask, thereby forming a first p-type doped layer 206 within the surface region of the p-type silicon substrate 200 inside the trenches 205.

Figure 7A:
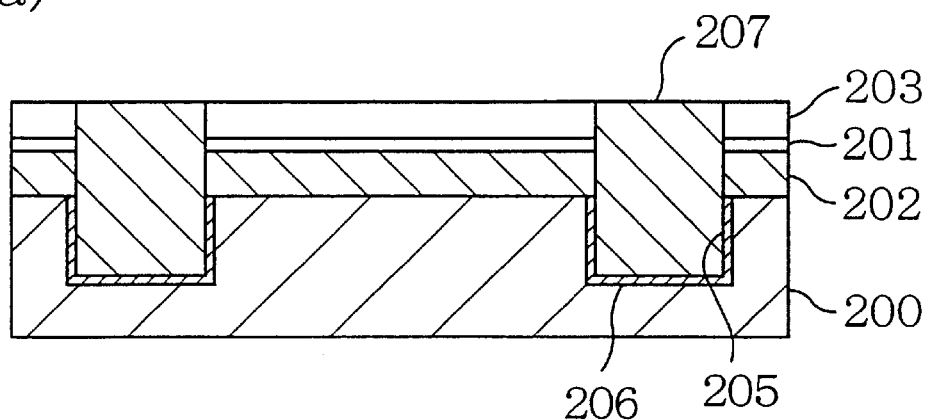
FIGS. 7(a) through 7(c) are cross-sectional views illustrating respective process steps for fabricating a semiconductor device according to the second embodiment.

Then, the first resist pattern 204 is removed. Thereafter, a silicon dioxide film is deposited by a CVD process, for example, over the entire surface of the second insulating film 203 as well as inside the trenches 205. And portions of the silicon dioxide film, which have been deposited on the second insulating film 203, are removed by a CMP technique, for example. In this manner, trench isolations 207 are formed such that the respective upper surfaces of the trench isolations 207 and the second insulating film 203 are substantially flush with each other and planarized as shown in FIG. 7(a).

Figure 7B:
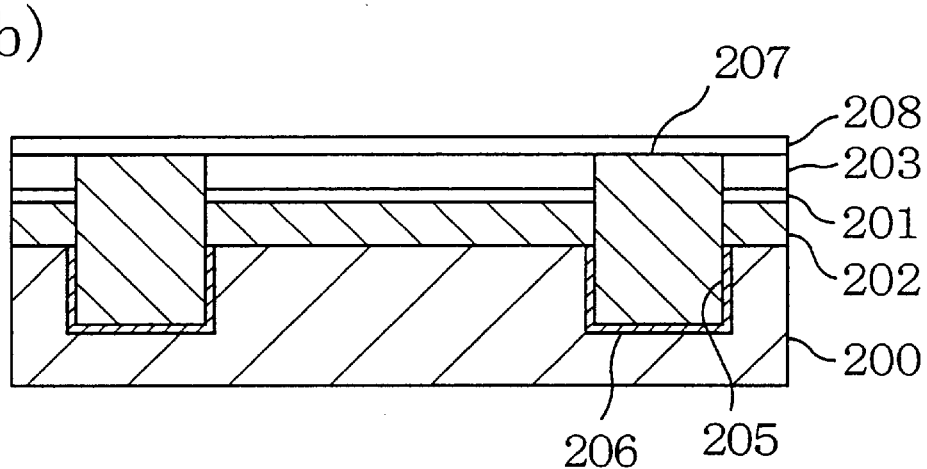

Next, as shown in FIG. 7(b), a third insulating film 208 of silicon nitride is deposited by a CVD process, for example, over the entire surface of the second insulating film 203 as well as over the trench isolations 207. In this process step, the third insulating film 208 needs to show etch selectivity with respect to a fourth insulating film 211 to be deposited later (see FIG. 8(a)). Also, the third insulating film 208 needs to be deposited to such a thickness that the film 208 is not completely removed by anisotropic etching to be performed on a fifth insulating film 215 to be deposited later (see FIGS. 8(c) and 9(a)).

Figure 7C:
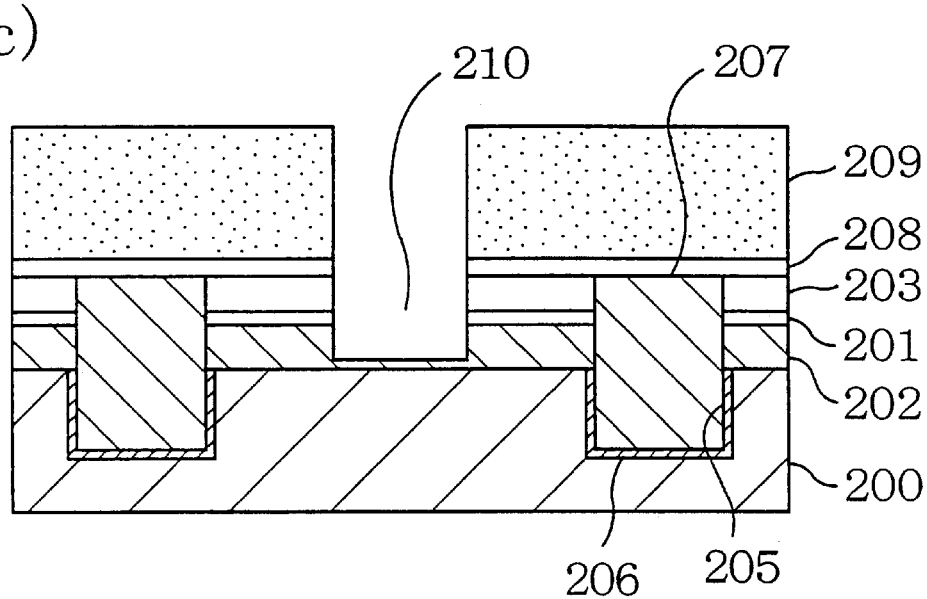

Subsequently, as shown in FIG. 7(c), a second resist pattern 209 is defined by photolithography on the third insulating film 208 to have an opening over a region where a gate electrode is to be formed. Thereafter, the third, second and first insulating films 208, 203 and 201 and p-type silicon substrate 200 are etched using the second resist pattern 209 as a mask, thereby forming a recess 210 to have its bottom located within the n-type doped layer 202.

Figure 8A:
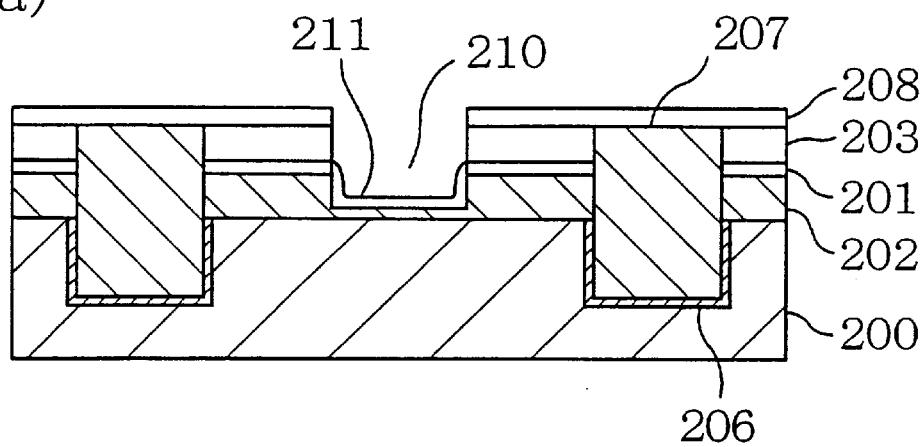
FIGS. 8(a) through 8(c) are cross-sectional views illustrating respective process steps for fabricating a semiconductor device according to the second embodiment.

Then, the second resist pattern 209 is removed. Next, as shown in FIG. 8(a), a fourth insulating film 211 of silicon dioxide is formed by thermal oxidation, for example, on the surface of the p-type silicon substrate 200, which is exposed inside the recess 210.

Figure 8B:
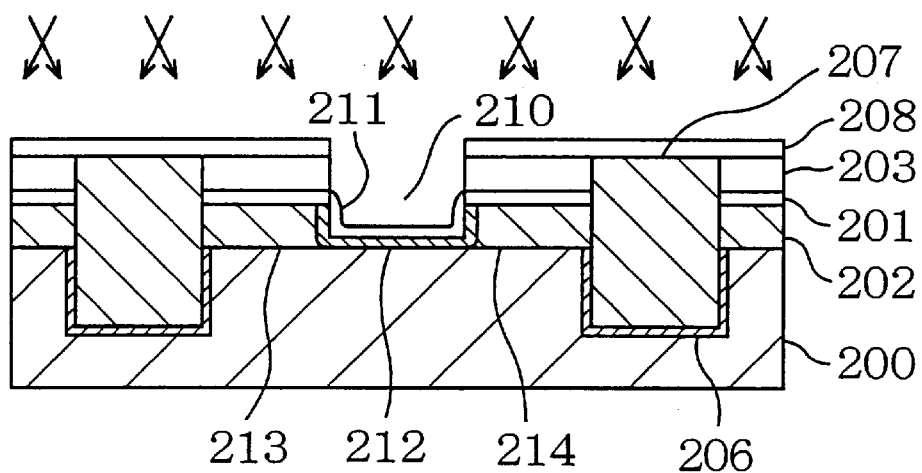

Thereafter, as shown in FIG. 8(b), p-type dopant ions are implanted into the p-type silicon substrate 200 using the third insulating film 208 as a mask, thereby forming an n-type lightly-doped layer 212 within the surface region of the p-type silicon substrate 200 inside the recess 210. The n-type lightly-doped layer 212 is formed to have its bottom located at a level substantially equal to, or deeper than, that of the n-type doped layer 202. The n-type dopant concentration of the n-type lightly-doped layer 212 is lower than that of the n-type doped layer 202. When the n-type lightly-doped layer 212 is divided into two by a second p-type doped layer 217 to be formed later (see FIG. 9(a)), respective regions of the n-type doped layer 202, which will be connected to the n-type lightly-doped layer 212, will be source/drain regions 213 and 214.

Figure 8C:
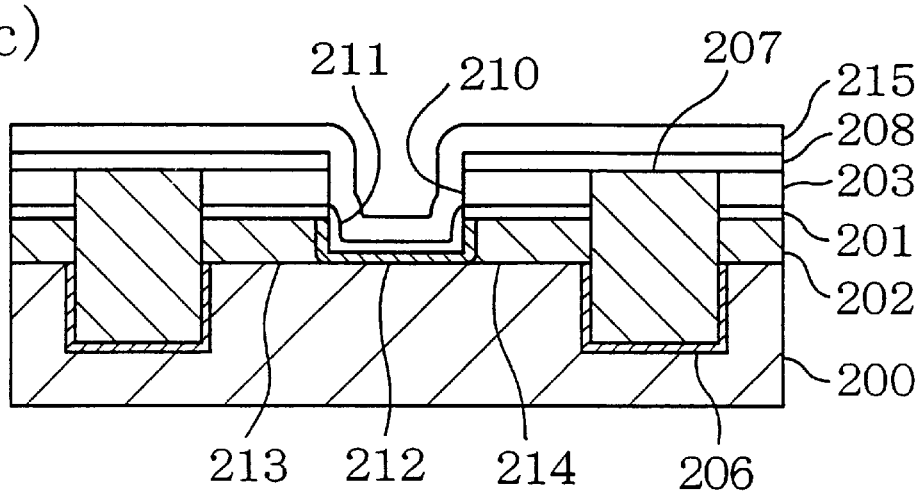

Next, as shown in FIG. 8(c), a fifth insulating film 215 of silicon nitride is deposited by a CVD process, for example, over the entire surface of the third insulating film 208 as well as inside the recess 210. In this process step, the fifth insulating film 215 needs to show etch selectivity with respect to the fourth insulating film 211.

Figure 9A:
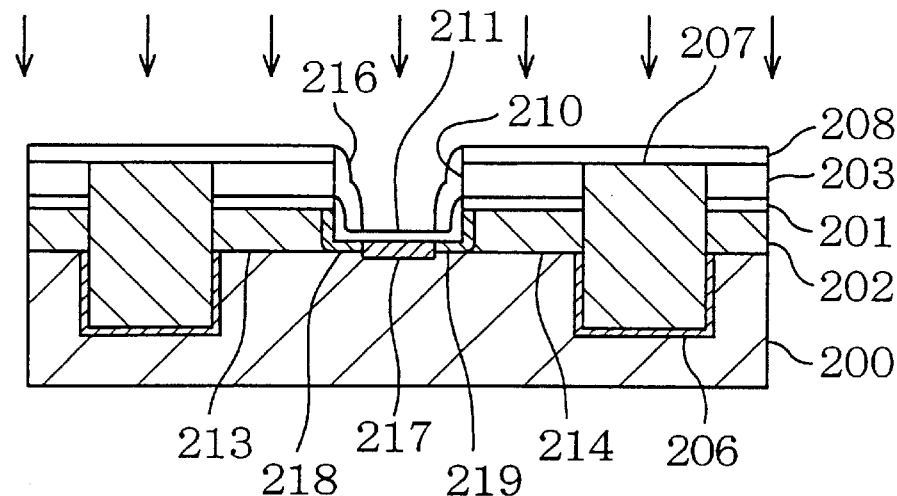
FIGS. 9(a) through 9(c) are cross-sectional views illustrating respective process steps for fabricating a semiconductor device according to the second embodiment.

Thereafter, as shown in FIG. 9(a), the fifth insulating film 215 is etched back anisotropically, thereby forming a sidewall 216 out of the fifth insulating film 215 on the wall of the recess 210 as well as over the fourth insulating film 211.

Then, p-type dopant ions are implanted into the p-type silicon substrate 200 using the third insulating film 208 and sidewall 216 as a mask, thereby forming a second p-type doped layer 217 in a region under part of the bottom of the recess 210, which is surrounded by the sidewall 216, so as to divide the n-type lightly-doped layer 212 into two. Since the n-type lightly-doped layer 212 is divided into two by the second p-type doped layer 217, first and second n-type lightly-doped regions 218 and 219 are formed between the source and drain regions 213 and 214 and the second p-type doped layer 217, respectively. In this case, if the second p-type doped layer 217 is formed to have its bottom located deeper than that of the n-type lightly-doped layer 212, then the threshold voltage of the resulting transistor can be high.

Figure 9B:
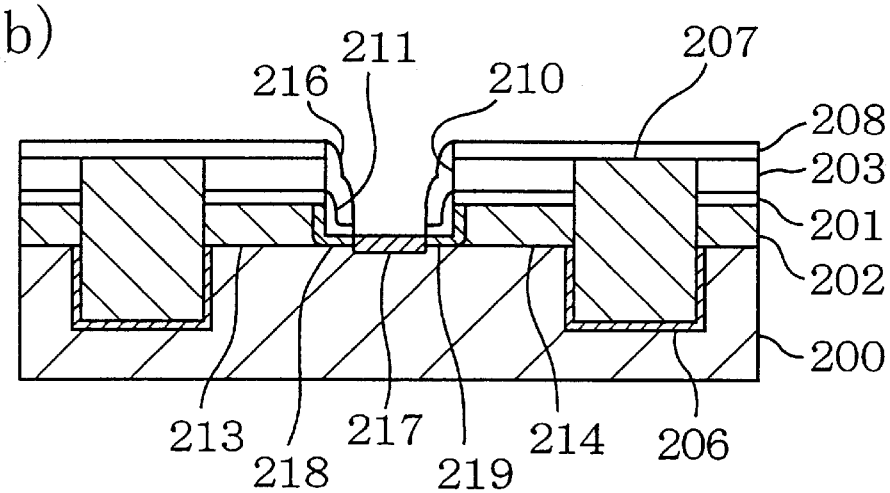

Thereafter, portion of the fourth insulating film 211, which is located on the second p-type doped layer 217, is wet-etched using an aqueous solution containing buffered hydrofluoric acid, thereby exposing the second p-type doped layer 217 as shown in FIG. 9(b).

Figure 9C:
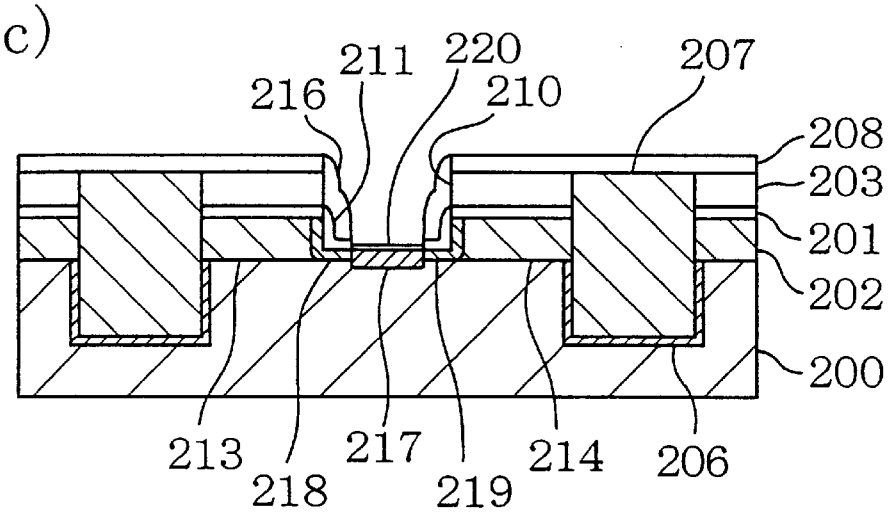

Next, as shown in FIG. 9(c), a gate insulating film 220 of silicon dioxide is formed on the second p-type doped layer 217 by thermal oxidation, for example.

Figure 10A:
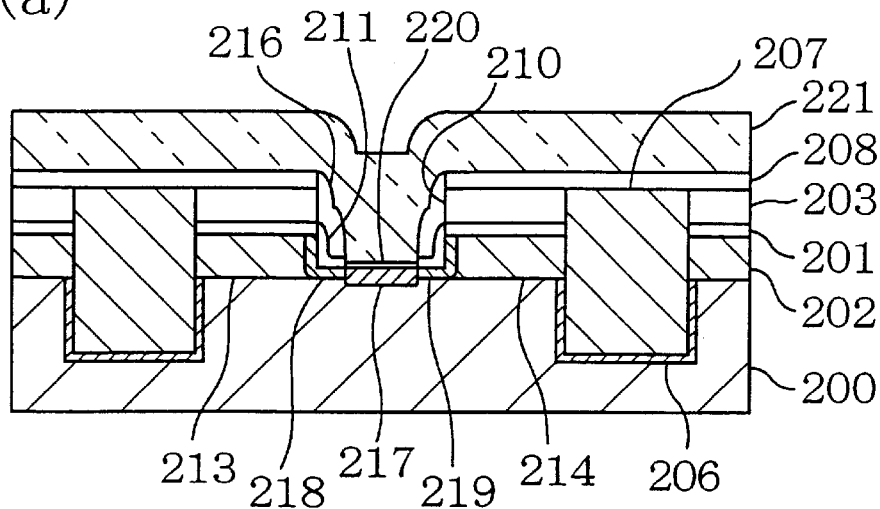
FIGS. 10(a) through 10(c) are cross-sectional views illustrating respective process steps for fabricating a semiconductor device according to the second embodiment.

Then, as shown in FIG. 10(a), a conductive film 221 of doped polysilicon, for example, is deposited over the entire surface of the third insulating film 208, as well as inside the recess 210.

Figure 10B:
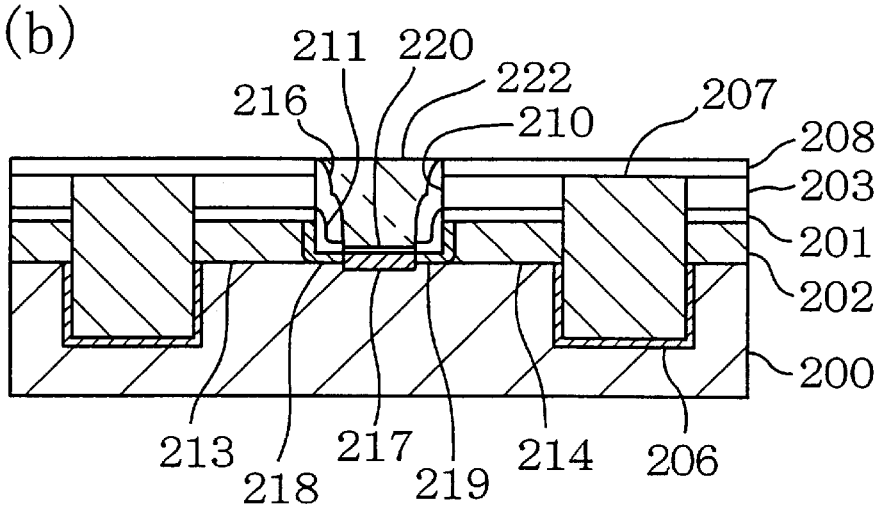

Subsequently, portions of the conductive film 221, which have been deposited on the third insulating film 208, are removed by a CMP technique, for example, thereby forming a gate electrode 222 such that the respective upper surfaces of the gate electrode 222 and the third insulating film 208 are substantially flush with each other and planarized as shown in FIG. 10(b).

Figure 10C:
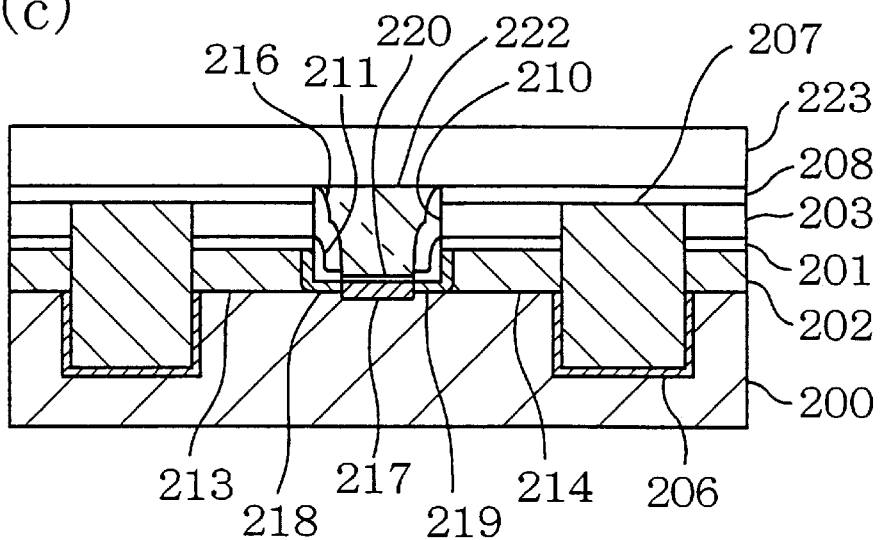

Next, as shown in FIG. 10(c), a sixth insulating film 223 of silicon dioxide is deposited by a CVD process, for example, over the entire surface of the third insulating film 208 as well as over the gate electrode 222.

Figure 11A:
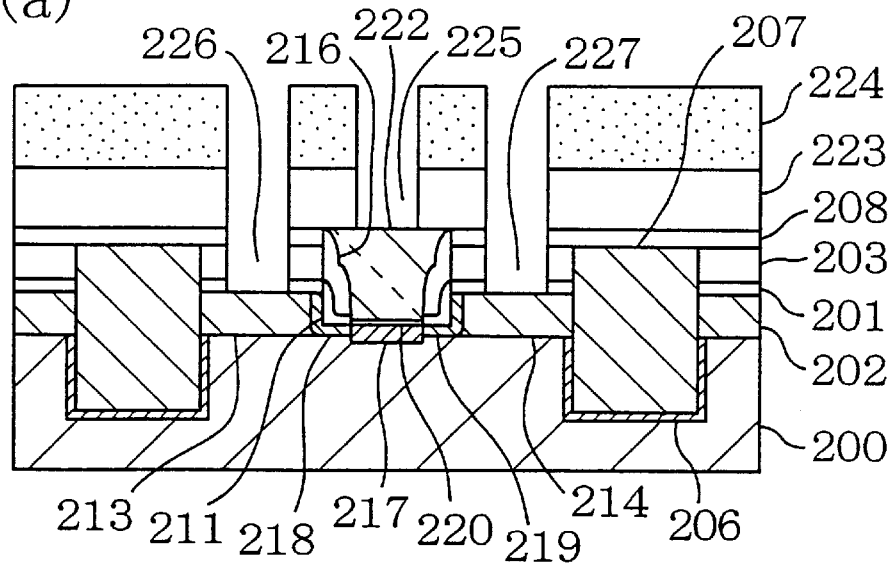
FIGS. 11(a) through 11(c) are cross-sectional views illustrating respective process steps for fabricating a semiconductor device according to the second embodiment.

Thereafter, as shown in FIG. 11(a), a third resist pattern 224 is defined by photolithography on the sixth insulating film 223 so as to have a plurality of openings over respective regions where contact holes are to be formed. Then, using the third resist pattern 224 as a mask, the sixth, third, second and first insulating films 223, 208, 203 and 201 are etched, thereby forming gate, source and drain contact holes 225, 226 and 227.

Figure 11B:
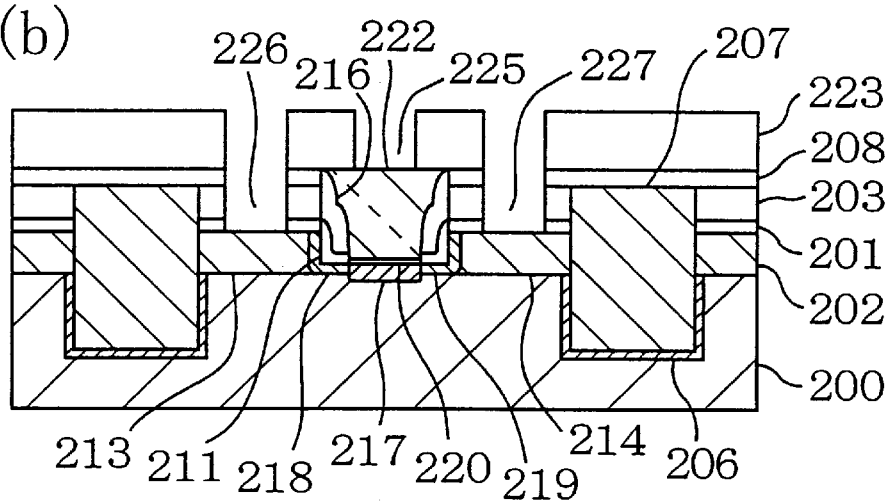

Next, as shown in FIG. 11(b), the third resist pattern 224 is removed.

Figure 11C:
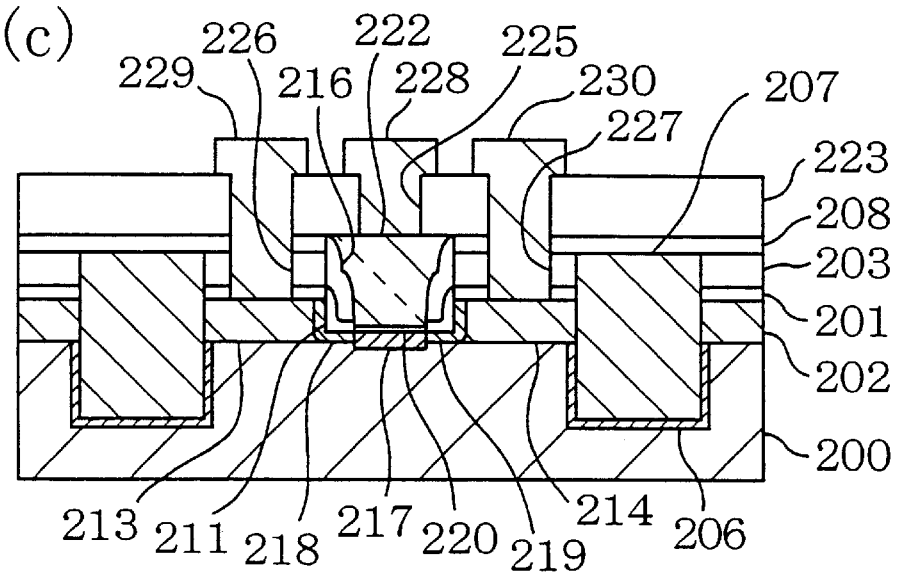

Finally, as shown in FIG. 11(c), metal interconnection layers 228, 229 and 230 are formed by stacking titanium nitride, aluminum, tungsten, titanium nitride and titanium films, for example, to fill in the gate, source and drain contact holes 225, 226 and 227 and to slightly protrude upward therefrom. The metal interconnection layers 228, 229 and 230 will be used as extension electrodes.

According to the second embodiment, the gate insulating film 220 is formed on the surface of the p-type silicon substrate 200, which is exposed inside the recess 210 provided for the p-type silicon substrate 200. Thereafter, the gate electrode 222 is formed by filling in the recess 210 with the conductive film 221. That is to say, since the gate electrode 222 can be formed without using the gate insulating film 220 as an etch stopper, it is possible to prevent the gate insulating film 220 from being damaged during the formation of the gate electrode 222. Accordingly, the thickness of the gate insulating film 220 can be reduced without sacrificing the reliability thereof, and therefore, the number of semiconductor devices integrated can be increased. In addition, even when the gate insulating film 220 is thinned, the gate electrode 222 still can be formed at a high aspect ratio, and the resistance of the gate electrode 222 can be reduced. Consequently, the semiconductor device can operate at a higher speed.

Also, according to the second embodiment, the second p-type doped layer 217 is formed in a region under the bottom of the recess 210 in such a manner as to divide not only the n-type doped layer 202 but also the n-type lightly-doped layer 212 into two. Thus, the source/drain regions 213 and 214 are formed out of the n-type doped layer 202, which has been divided into two by the second p-type doped layer 217. Accordingly, the formation of a channel can be controlled by applying a voltage to the gate electrode 222 to be formed over the second p-type doped layer 217, thus improving the reliability of the semiconductor device.

In addition, according to the second embodiment, the conductive film 221 is deposited over the entire surface of the third insulating film 208, as well as inside the recess 210. Thereafter, portions of the conductive film 221 that have been deposited on the third insulating film 208 are removed, thereby forming the gate electrode 222 such that the respective upper surfaces of the gate electrode 222 and the third insulating film 208 are substantially flush with each other and planarized. Thus, the upper surface of the third insulating film 208, which will be an underlying layer in a subsequent process step, can be planarized when the gate electrode 222 is formed. Accordingly, upper-level interconnects or devices can be formed on the third insulating film 208, as well as on the gate electrode 222, without newly performing a planarization process step. As a result, a multilevel structure can be formed for the semiconductor device more easily.

Moreover, according to the second embodiment, the recess 210 is formed to have the bottom thereof located within the n-type doped layer 202, i.e., under the surface of the p-type silicon substrate 200. Thus, the bottom of the gate electrode 222 can be located under the surface of the p-type silicon substrate 200. Therefore, the aspect ratio of the source/drain contact holes 226 and 227 can be lower compared to forming the entire gate electrode with the same thickness as that of the gate electrode 222 above the surface of the semiconductor substrate. Accordingly, the respective process steps of forming the source/drain contact holes 226 and 227 and filling in the contact holes with a conductive material can be performed with a lot more certainty, thus improving the reliability of the semiconductor device.

Hereinafter, it will be described with reference to FIGS. 12(*a*) and 12(*b*) how the aspect ratio of source/drain contact holes differs depending on whether a gate electrode with the same thickness is formed by the conventional method or the method according to the second embodiment of the present invention.

Figure 12A:
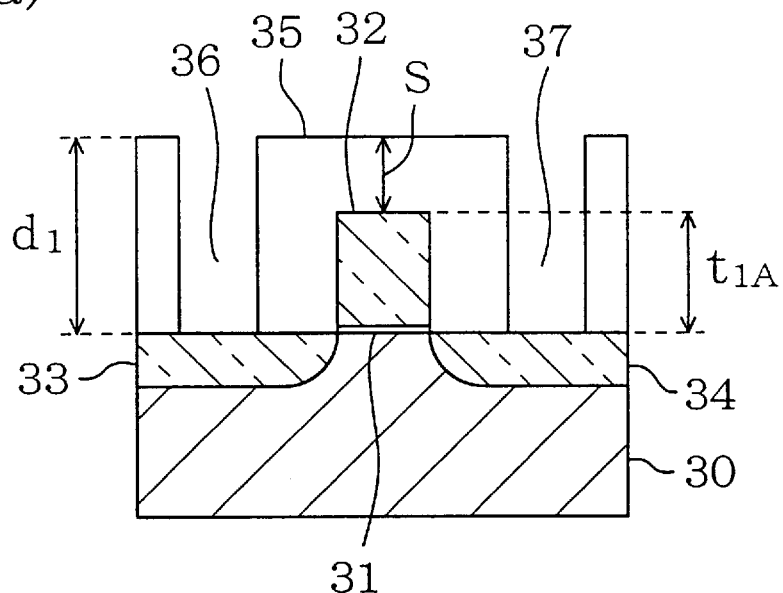
FIG. 12(a) is a cross-sectional view illustrating a structure of a semiconductor device fabricated by a conventional method as a first comparative example.
Figure 12B:
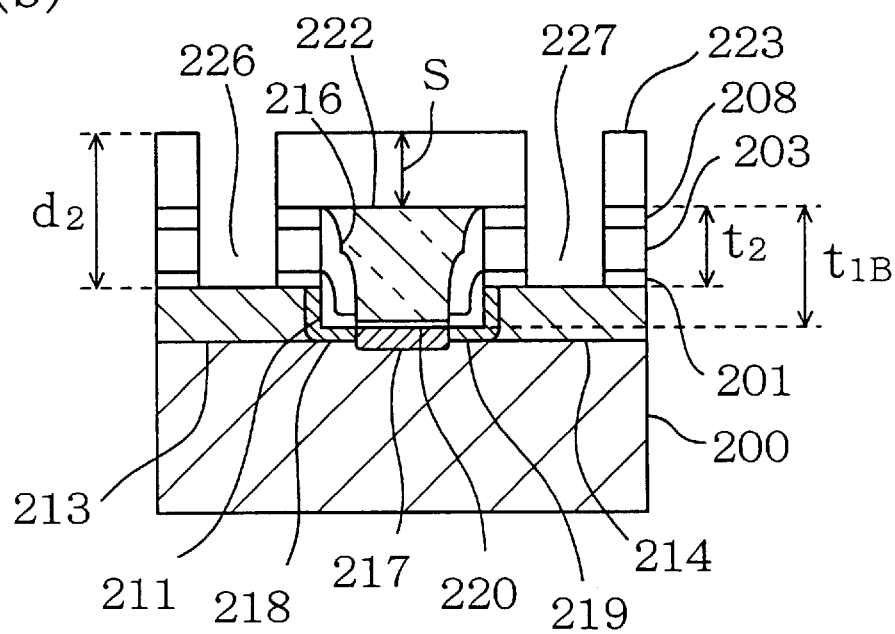
FIG. 12(b) is a cross-sectional view illustrating the structure of the semiconductor device fabricated by the method according to the second embodiment.

FIG. 12(*a*) illustrates a cross-sectional structure of a semiconductor device fabricated by a conventional method as a first comparative example, and FIG. 12(*b*) illustrates a cross-sectional structure of the semiconductor device fabricated by the method according to the second embodiment of the present invention. In FIG. 12(*b*), the same components as those illustrated in the cross-sectional view of FIG. 11(*b*) showing a process step according to the second embodiment are identified by the same reference numerals, and the description thereof will be omitted herein.

In FIG. 12(*a*), a silicon substrate is identified by 30, gate insulating film 31, gate electrode 32, source region 33, drain region 34, insulating film 35, source contact hole 36 and drain contact hole 37. In the example illustrated in FIG. 12(*a*), the gate electrode 32 is formed entirely above the surface of the silicon substrate 30, i.e., above the surface of the source/drain regions 33 and 34.

Also, in FIG. 12(*a*), $t_{1A}$ represents a distance between the surface of the silicon substrate 30 and the top of the gate electrode 32. $d_1$ represents the depth of the source/drain contact holes 36 and 37. And S represents the thickness of a portion of the insulating film 35 located over the gate electrode 32. In this case, $d_1 = t_{1A} + S$.

Supposing the respective thicknesses of the gate insulating film 31 and gate electrode 32 are identified by $t_{GO}$ and $t_{GE}$ although not shown in FIG. 12(*a*), $t_{1A} = t_{GO} + t_{GE}$.

In FIG. 12(*b*) on the other hand, $t_{1B}$ represents a distance between the surface of the second p-type doped layer 217 and the top of the gate electrode 222. $t_2$ represents a distance between the surface of the p-type silicon substrate 200, i.e., the surface of the source/drain regions 213 and 214, and the top of the gate electrode 222. $d_2$ represents the depth of the source/drain contact holes 226 and 227. And S represents the thickness of the sixth insulating film 223 located over the gate electrode 222, which is equal to the thickness S shown in FIG. 12(*a*). The opening width of the source/drain contact holes 226 and 227 is supposed to be equal to that of the source/drain contact holes 36 and 37 shown in FIG. 12(*a*).

Supposing the respective thicknesses of the gate insulating film 220 and gate electrode 222 are identified by $t_{GO}$ and $t_{GE}$ (which are equal to the thicknesses $t_{GO}$ and $t_{GE}$ as in the example shown in FIG. 12(*a*)) although not shown in FIG. 12(*b*), $t_{1B} = t_{GO} + t_{GE} = t_{1A}$.

Thus, as shown in FIG. 12(*b*), the depth $d_2$ of the source/drain contact holes 226 and 227 is equal to the sum of $t_2$ and S. On the other hand, since $t_2 < t_{1B} = t_{1A}$, $d_2 < d_1$.

As described above, if gate electrodes with the same thickness are formed by the conventional method and the method according to the second embodiment of the present invention, respectively, the aspect ratio of the source/drain contact holes attained by the method according to the second embodiment can be lower.

Also, according to the second embodiment, the bottom of the gate electrode 222 can be located under the surface of the p-type silicon substrate 200. Thus, compared to forming source/drain contact holes with the same depth and same aspect ratio as those of the source/drain contact holes 226 and 227 and yet forming the entire gate electrode above the surface of a semiconductor substrate, the gate electrode 222 can be thicker. As a result, the resistance of the gate electrode 222 can be reduced and the semiconductor device can operate at a higher speed.

Hereinafter, it will be described with reference to FIGS. 13(*a*) and 13(*b*) how the thickness of a gate electrode differs depending on whether source/drain contact holes with the same depth and same aspect ratio are formed by the conventional method or the method according to the second embodiment of the present invention.

FIG. 13(*a*) illustrates a cross-sectional structure of a semiconductor device fabricated by a conventional method as a second comparative example, and FIG. 13(*b*) illustrates a cross-sectional structure of a semiconductor device fabricated by the method according to the second embodiment of the present invention. In FIG. 13(*b*), the same components as those illustrated in the cross-sectional view of FIG. 11(*b*) showing a process step according to the second embodiment are identified by the same reference numerals, and the description thereof will be omitted herein.

Figure 13A:
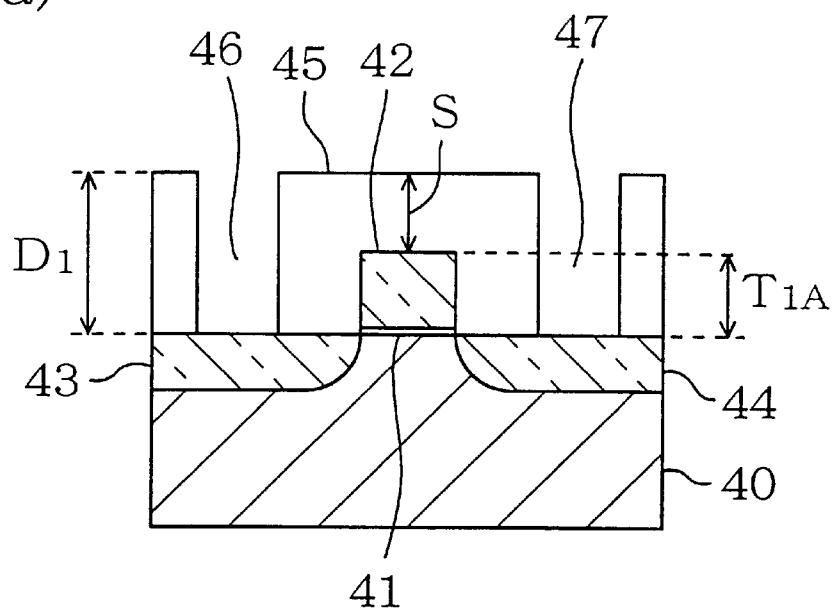
FIG. 13(a) is a cross-sectional view illustrating the structure of the semiconductor device fabricated by the conventional method as a second comparative example.

In FIG. 13(*a*), a silicon substrate is identified by 40, gate insulating film 41, gate electrode 42, source region 43, drain region 44, insulating film 45, source contact hole 46, and drain contact hole 47. In the example illustrated in FIG. 13(a), the gate electrode 42 is formed entirely above the surface of the silicon substrate 40, i.e., above the surface of the source/drain regions 43 and 44.

Also, in FIG. 13(a), $T_{1A}$ represents a distance between the surface of the silicon substrate 40 and the top of the gate electrode 42. $D_1$ represents the depth of the source/drain contact holes 46 and 47. And S represents the thickness of a portion of the insulating film 45 located over the gate electrode 42. In this case, $T_{1A}=D_1-S$.

Supposing the thickness of the gate insulating film 41 is identified by $t_{GO}$ although not shown in FIG. 13(a), the thickness $T_{GE1}$ of the gate electrode 42 is $T_{1A}-t_{GO}$.

Figure 13B:
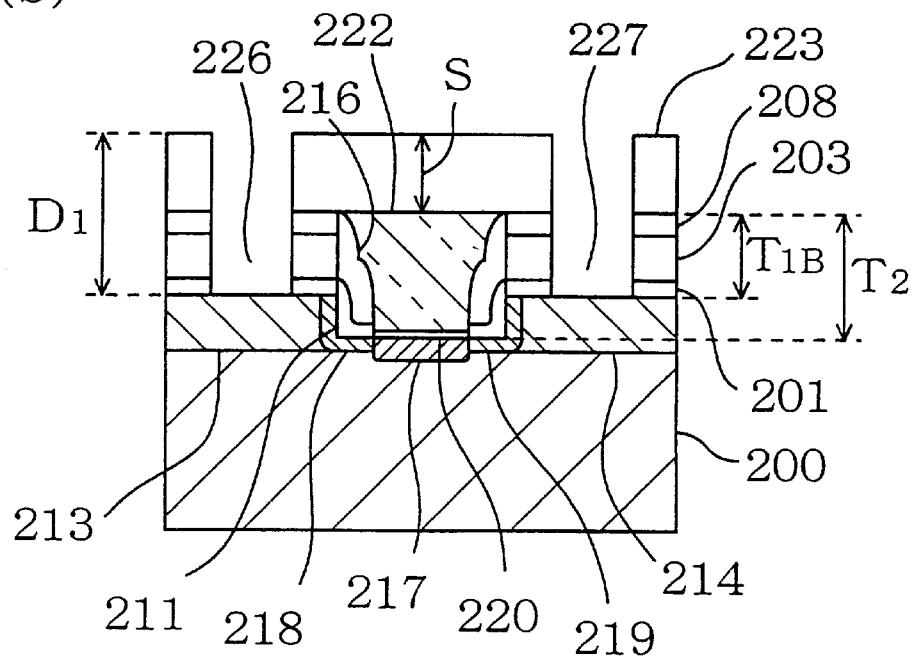
FIG. 13(b) is a cross-sectional view illustrating the structure of the semiconductor device fabricated by the method according to the second embodiment.

In FIG. 13(b) on the other hand, $T_{1B}$ represents a distance between the surface of the p-type silicon substrate 200, i.e., the surface of the source/drain regions 213 and 214, and the top of the gate electrode 222. $T_2$ represents a distance between the surface of the second p-type doped layer 217 and the top of the gate electrode 222. $D_1$ represents the depth of the source/drain contact holes 226 and 227, which is equal to the depth $D_1$ shown in FIG. 13(a). And S represents the thickness of the sixth insulating film 223 located over the gate electrode 222, which is equal to the thickness S shown in FIG. 13(a). The opening width of the source/drain contact holes 226 and 227 is supposed to be equal to that of the source/drain contact holes 46 and 47 shown in FIG. 13(a).

Supposing the thickness of the gate insulating film 220 is identified by $t_{GO}$ (which is equal to the thickness $t_{GO}$ as in the example shown in FIG. 13(a)) although not shown in FIG. 13(b), the thickness $T_{GE2}$ of the gate electrode 222 is $T_2-t_{GO}$.

Thus, as shown in FIG. 13(b), $T_{1B}=D_1-S$. On the other hand, since $T_2>T_{1B}=T_{1A}=D_1-S$, $T_{GE2}>T_{GE1}$.

As described above, if source/drain contact holes with the same depth and same aspect ratio are formed by the conventional method and the method according to the second embodiment of the present invention, respectively, the gate electrode formed by the method according to the second embodiment can be thicker.

In addition, according to the second embodiment, the sidewall 216 is formed on the wall of the recess 210. Accordingly, the source/drain regions 213 and 214 can be insulated from the gate electrode 222 with more certainty, thus improving the reliability of the semiconductor device.

Moreover, according to the second embodiment, the n-type lightly-doped layer 212 is formed within the surface region of the p-type silicon substrate 200 inside the recess 210 to have its bottom located at a level substantially equal to, or deeper than, that of the n-type doped layer 202. Thereafter, the second p-type doped layer 217 is formed in a region under part of the bottom of the recess 210, which is surrounded by the sidewall 216, so as to divide the n-type lightly-doped layer 212 into two. Since the n-type lightly-doped layer 212 is divided into two by the second p-type doped layer 217, the first and second n-type lightly-doped regions 218 and 219 are formed between the source/drain regions 213 and 214 and the second p-type doped layer 217, respectively. Accordingly, the intensity of an electric field, which is created by applying a voltage between the source/drain regions 213 and 214, can be reduced, thus improving the reliability of the semiconductor device.

Furthermore, according to the second embodiment, the third insulating film 208 is deposited to such a thickness that the film 208 is not completely removed by anisotropic etching to be performed on the fifth insulating film 215. Thus, when the fifth insulating film 215 is etched anisotropically, the third insulating film 208 is not removed completely, and therefore the trench isolations 207 are not damaged, either. As a result, the reliability of the semiconductor device improves.

Moreover, according to the second embodiment, the third and fifth insulating films 208 and 215 both show etch selectivity with respect to the fourth insulating film 211. Thus, when the fourth insulating film 211 is etched, neither the third insulating film 208 nor the sidewall 216 made of the fifth insulating film 215 is removed, and therefore, the recess 210 is not damaged. As a result, the gate electrode 222 can be formed exactly at its desired size, thus improving the reliability of the semiconductor device.

In the second embodiment, the conductive film 221 is made of doped polysilicon. Alternatively, the conductive film 221 may be a single-layer film of tungsten, molybdenum, titanium, platinum, copper, tungsten silicide, molybdenum silicide, titanium silicide or platinum silicide, or a multilayer film consisting of a doped polysilicon film and a tungsten silicide, molybdenum silicide, titanium silicide or platinum silicide film.

Also, in the second embodiment, an n-channel MOS transistor is formed using the p-type silicon substrate 200. However, the same effects are attainable if a p-channel MOS transistor is formed using an n-type silicon substrate instead.

Embodiment 3

Hereinafter, a method for fabricating a semiconductor device according to a third embodiment of the present invention will be described with reference to FIGS. 14(a) through 14(c), 15(a) through 15(c), 16(a) through 16(c), 17(a) through 17(c), 18(a) through 18(c), 19(a) and 19(b) and 20(a) and 20(b).

Figure 14A:
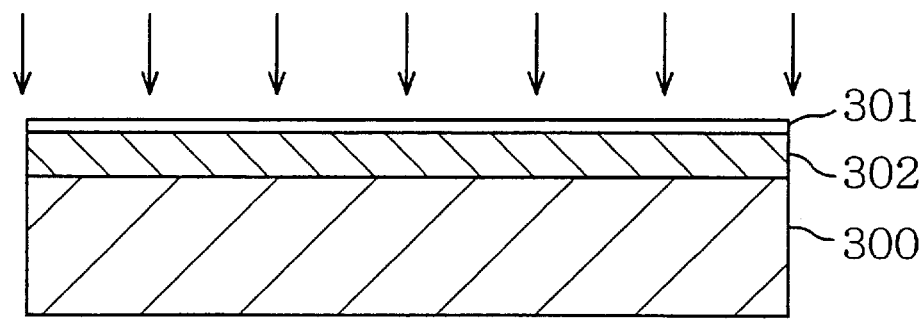
FIGS. 14(a) through 14(c) are cross-sectional views illustrating respective process steps for fabricating a semiconductor device according to a third embodiment of the present invention.

First, as shown in FIG. 14(a), a first insulating film 301 of silicon dioxide is formed on a p-type silicon substrate 300 by thermal oxidation, for example. Then, n-type dopant ions are implanted into the p-type silicon substrate 300 using the first insulating film 301 as a protective film, thereby forming an n-type doped layer 302 under the first insulating film 301 within the p-type silicon substrate 300.

Figure 14B:
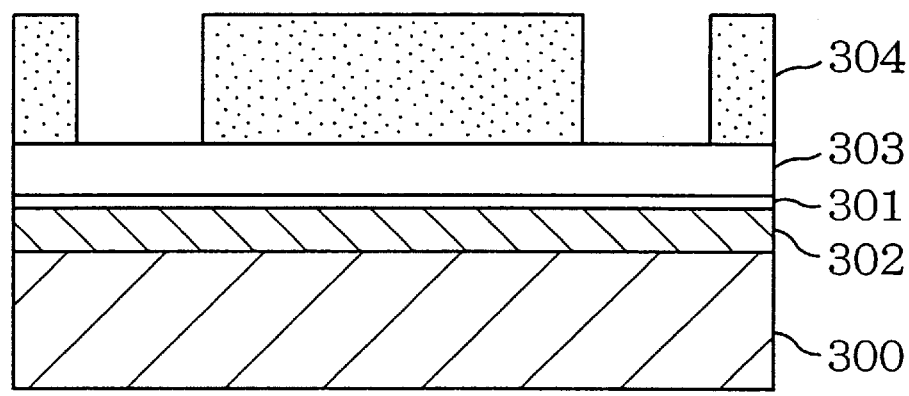

Next, as shown in FIG. 14(b), a second insulating film 303 of silicon nitride is deposited on the first insulating film 301 by a CVD process, for example. Then, a first resist pattern 304 is defined by photolithography on the second insulating film 303 to have a plurality of openings over respective regions where trench isolations are to be formed.

Figure 14C:
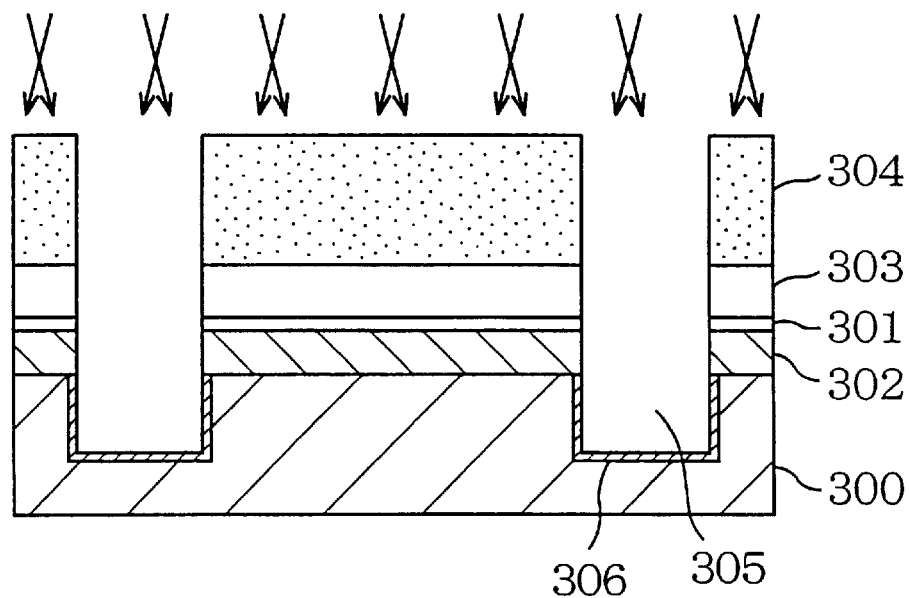

Subsequently, as shown in FIG. 14(c), the second insulating film 303, first insulating film 301 and p-type silicon substrate 300 are etched using the first resist pattern 304 as a mask, thereby forming trenches 305 within the p-type silicon substrate 300. Thereafter, p-type dopant ions are implanted into the p-type silicon substrate 300 using the first resist pattern 304 as a mask, thereby forming a first p-type doped layer 306 within the surface region of the p-type silicon substrate 300 inside the trenches 305.

Figure 15A:
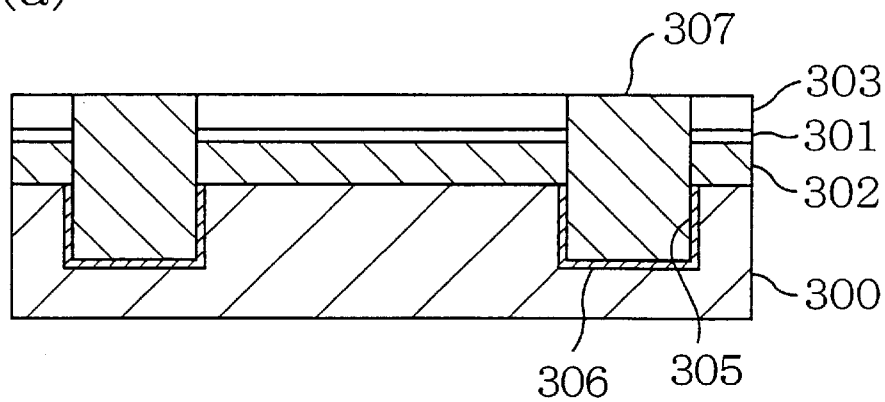
FIGS. 15(a) through 15(c) are cross-sectional views illustrating respective process steps for fabricating a semiconductor device according to the third embodiment.

Then, the first resist pattern 304 is removed. Thereafter, a silicon dioxide film is deposited by a CVD process, for example, over the entire surface of the second insulating film 303 as well as inside the trenches 305. And portions of the silicon dioxide film, which have been deposited on the second insulating film 303, are removed by a CMP technique, for example. In this manner, trench isolations 307 are formed such that the respective upper surfaces of the trench isolations 307 and second insulating film 303 are substantially flush with each other and planarized as shown in FIG. 15(a).

Figure 15B:
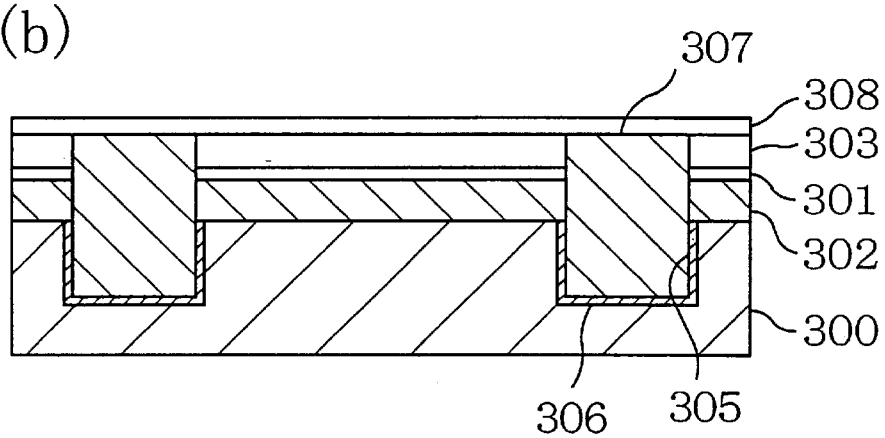

Next, as shown in FIG. 15(b), a third insulating film 308 of silicon nitride is deposited by a CVD process, for example, over the entire surface of the second insulating film 303 as well as over the trench isolations 307. In this process step, the third insulating film 308 needs to show etch selectivity with respect to a fourth insulating film 311 to be deposited later (see FIG. 16(a)). Also, the third insulating film 308 should be deposited to such a thickness that the film 308 is not completely removed by anisotropic etching to be performed on a fifth insulating film 317 to be deposited later (see FIGS. 16(c) and 17(a)).

Figure 15C:
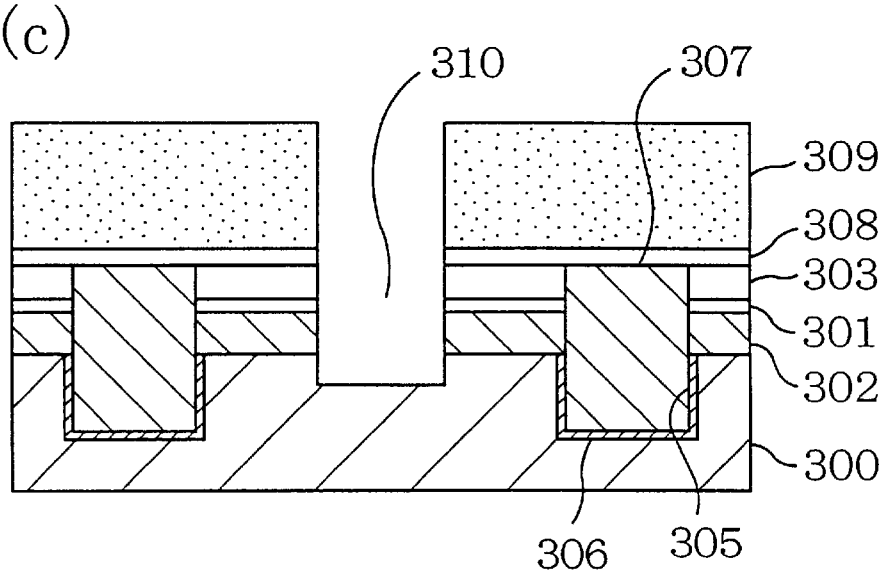

Subsequently, as shown in FIG. 15(c), a second resist pattern 309 is defined by photolithography on the third insulating film 308 to have an opening over a region where a gate electrode is to be formed. Thereafter, the third, second and first insulating films 308, 303 and 301 and p-type silicon substrate 300 are etched using the second resist pattern 309 as a mask, thereby forming a recess 310 to have its bottom located deeper than that of the n-type doped layer 302. As a result, source/drain regions are formed out of the n-type doped layer 302, which has been divided by the recess 310 into two (see source/drain regions 315 and 316 shown in FIG. 16(b)).

Figure 16A:
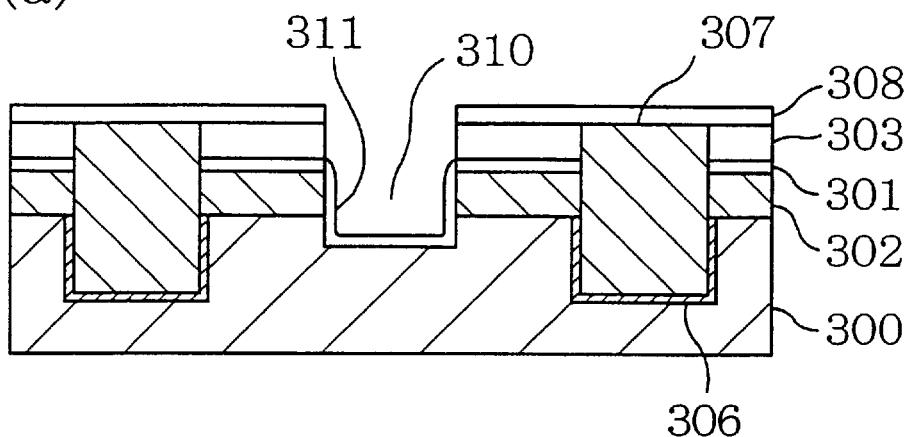
FIGS. 16(a) through 16(c) are cross-sectional views illustrating respective process steps for fabricating a semiconductor device according to the third embodiment.

Then, the second resist pattern 309 is removed. Next, as shown in FIG. 16(a), a fourth insulating film 311 of silicon dioxide is formed by thermal oxidation, for example, on the surface of the p-type silicon substrate 300, which is exposed inside the recess 310.

Figure 16B:
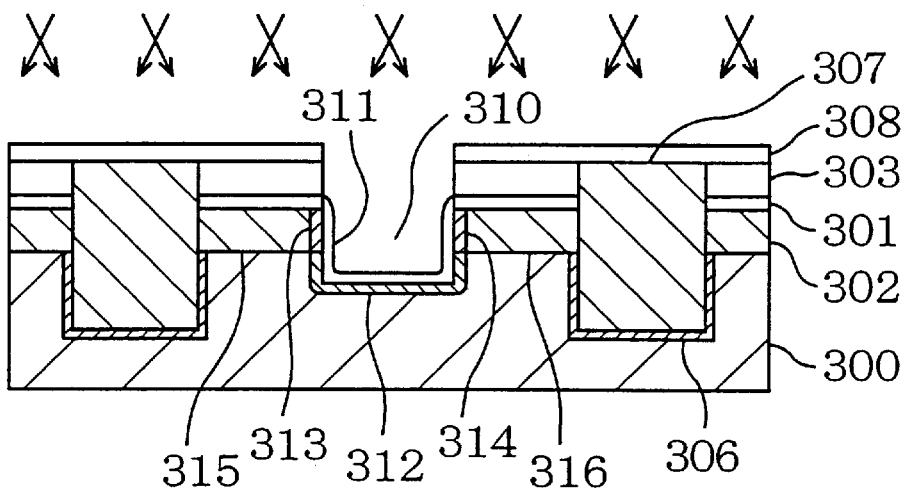

Thereafter, as shown in FIG. 16(b), n-type dopant ions are implanted into the p-type silicon substrate 300 using the third insulating film 308 as a mask, thereby forming an n-type lightly-doped layer 312 to be connected to the n-type doped layer 302, i.e., the source/drain regions 315 and 316, within the surface region of the p-type silicon substrate 300 inside the recess 310. The n-type dopant concentration of the n-type lightly-doped layer 312 is lower than that of the n-type doped layer 302. In this process step, first and second n-type heavily-doped regions 313 and 314 with an n-type dopant concentration somewhat higher than that of the n-type doped layer 302 are formed in respective parts of the source/drain regions 315 and 316 near the wall of the recess 310.

Figure 16C:
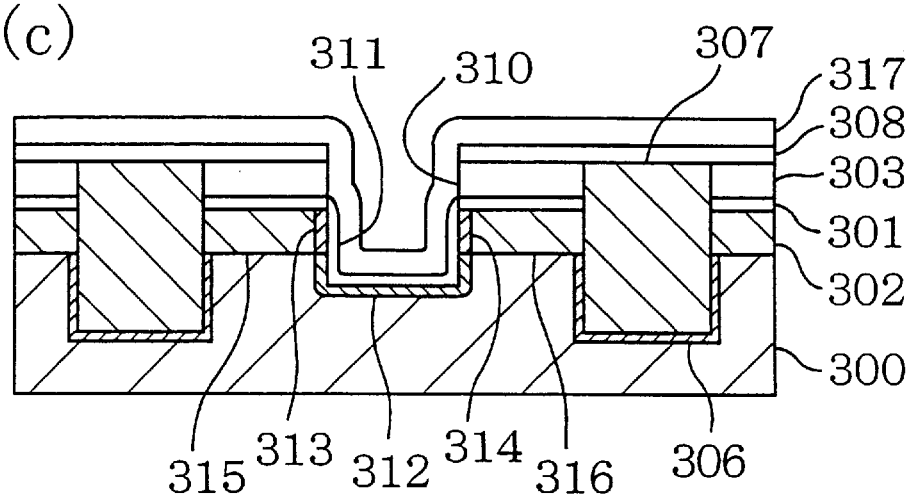

Next, as shown in FIG. 16(c), a fifth insulating film 317 of silicon nitride is deposited by a CVD process, for example, over the entire surface of the third insulating film 308 as well as inside the recess 310. In this process step, the fifth insulating film 317 needs to show etch selectivity with respect to the fourth insulating film 311.

Figure 17A:
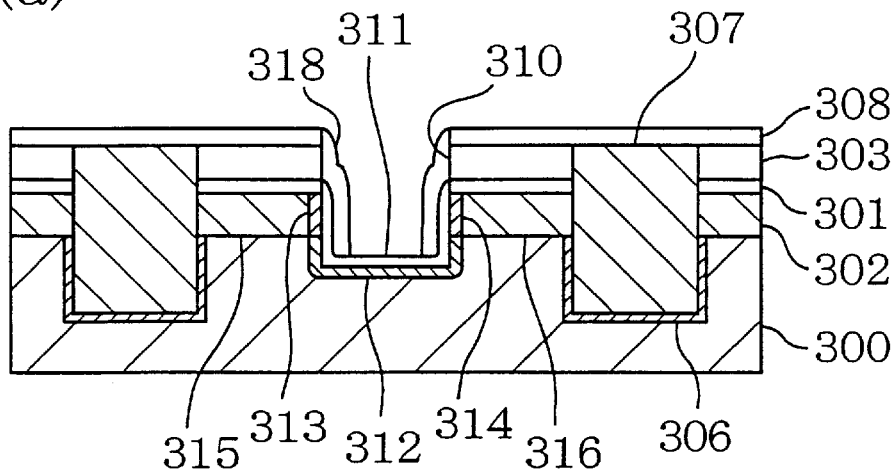
FIGS. 17(a) through 17(c) are cross-sectional views illustrating respective process steps for fabricating a semiconductor device according to the third embodiment.

Thereafter, as shown in FIG. 17(a), the fifth insulating film 317 is etched back anisotropically, thereby forming a sidewall 318 out of the fifth insulating film 317 on the wall of the recess 310 as well as on the fourth insulating film 311.

Figure 17B:
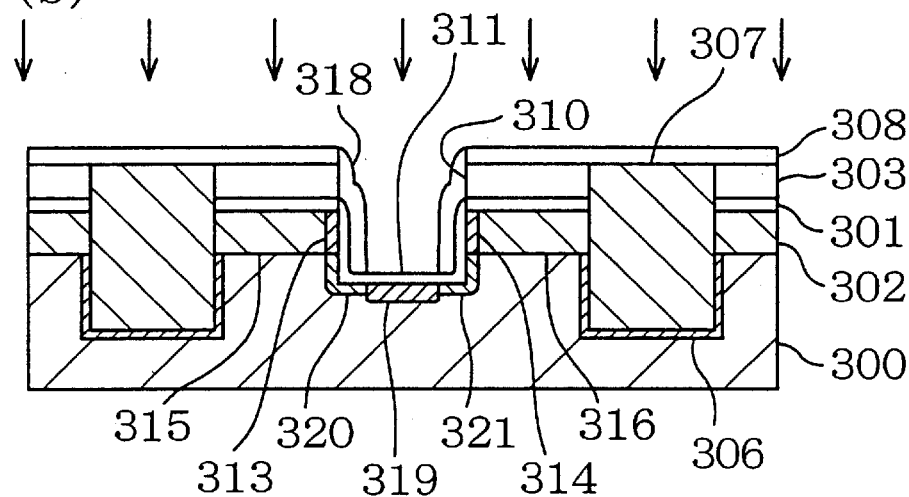

Then, as shown in FIG. 17(b), p-type dopant ions are implanted into the p-type silicon substrate 300 using the third insulating film 308 and sidewall 318 as a mask, thereby forming a second p-type doped layer 319 in a region under part of the bottom of the recess 310, which is surrounded by the sidewall 318, so as to divide the n-type lightly-doped layer 312 into two. Since the n-type lightly-doped layer 312 is divided into two by the p-type doped layer 319, first and second n-type lightly-doped regions 320 and 321 are formed between the source/drain regions 315 and 316 and the second p-type doped layer 319. In this case, if the second p-type doped layer 319 is formed so as to have its bottom located deeper than that of the n-type lightly-doped layer 312, then the threshold voltage of the resulting transistor can be high.

Figure 17C:
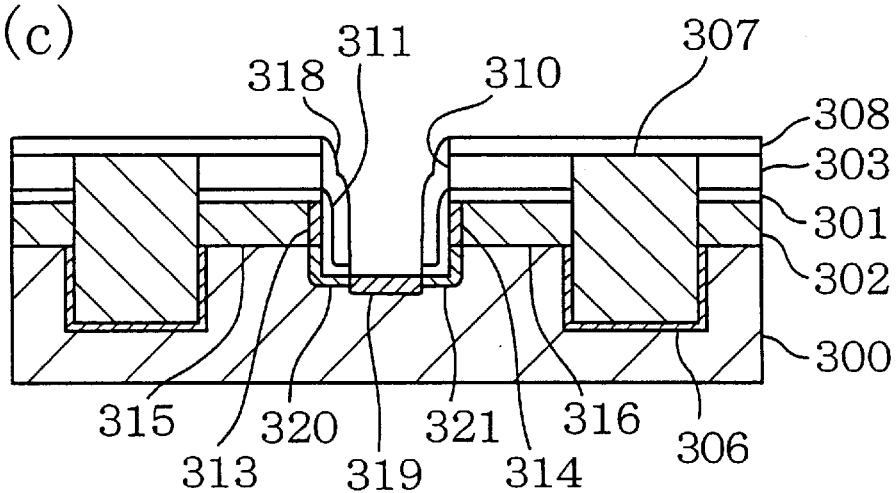

Thereafter, portion of the fourth insulating film 311, which is located on the second p-type doped layer 319, is wet-etched using an aqueous solution containing buffered hydrofluoric acid, for example, thereby exposing the second p-type doped layer 319 as shown in FIG. 17(c).

Figure 18A:
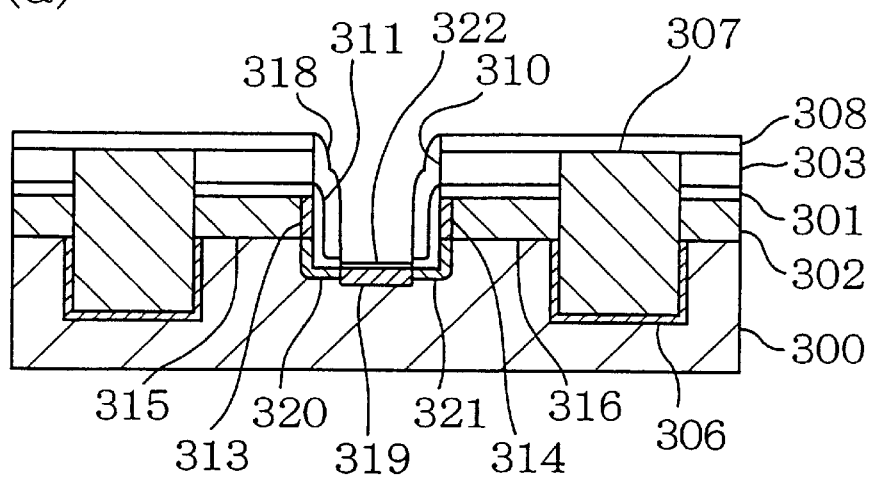
FIGS. 18(a) through 18(c) are cross-sectional views illustrating respective process steps for fabricating a semiconductor device according to the third embodiment.

Next, as shown in FIG. 18(a), a gate insulating film 322 of silicon dioxide is formed on the second p-type doped layer 319 by thermal oxidation, for example.

Figure 18B:
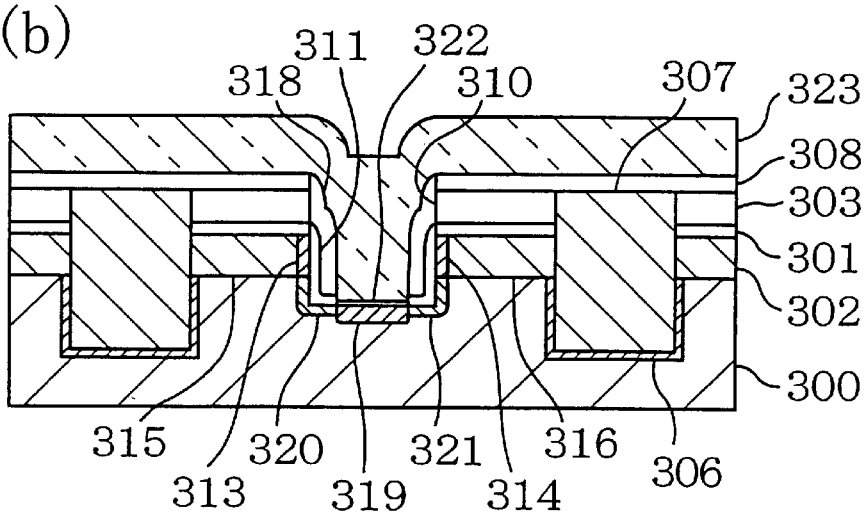

Then, as shown in FIG. 18(b), a conductive film 323 of doped polysilicon, for example, is deposited over the entire to surface of the third insulating film 308, as well as inside the recess 310.

Figure 18C:
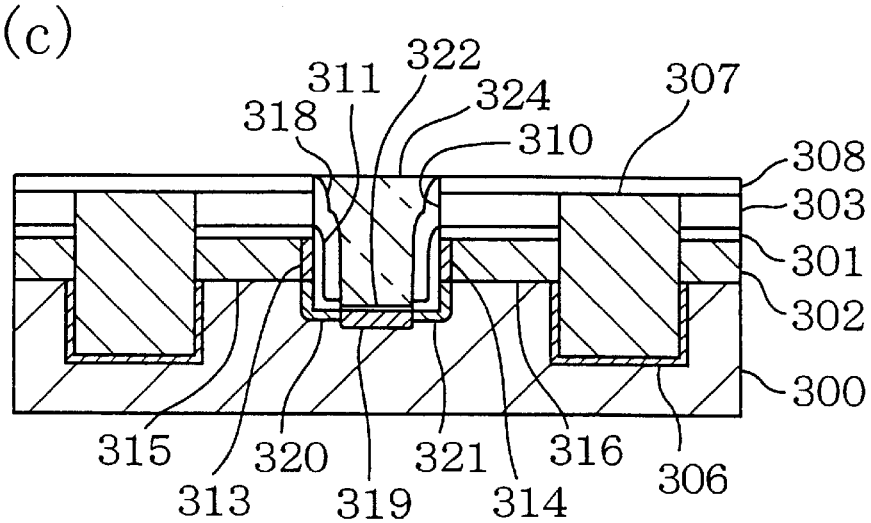

Subsequently, portions of the conductive film 323, which have been deposited on the third insulating film 308, are removed by a CMP technique, for example, thereby forming a gate electrode 324 such that the respective upper surfaces of the gate electrode 324 and third insulating film 308 are substantially flush with each other and planarized as shown in FIG. 18(c).

Figure 19A:
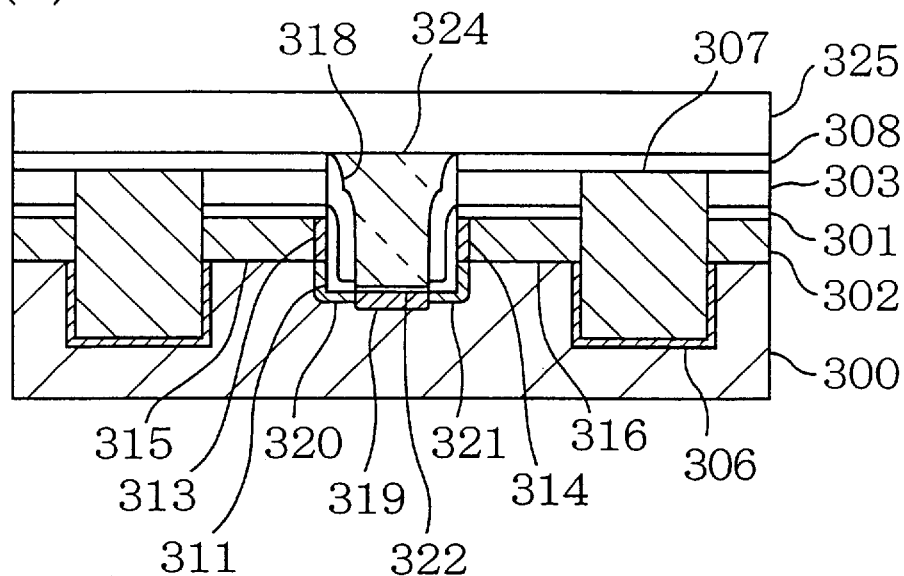
FIGS. 19(a) and 19(b) are cross-sectional views illustrating respective process steps for fabricating a semiconductor device according to the third embodiment.

Next, as shown in FIG. 19(a), a sixth insulating film 325 of silicon dioxide is deposited by a CVD process, for example, over the entire surface of the third insulating film 308 as well as over the gate electrode 324.

Figure 19B:
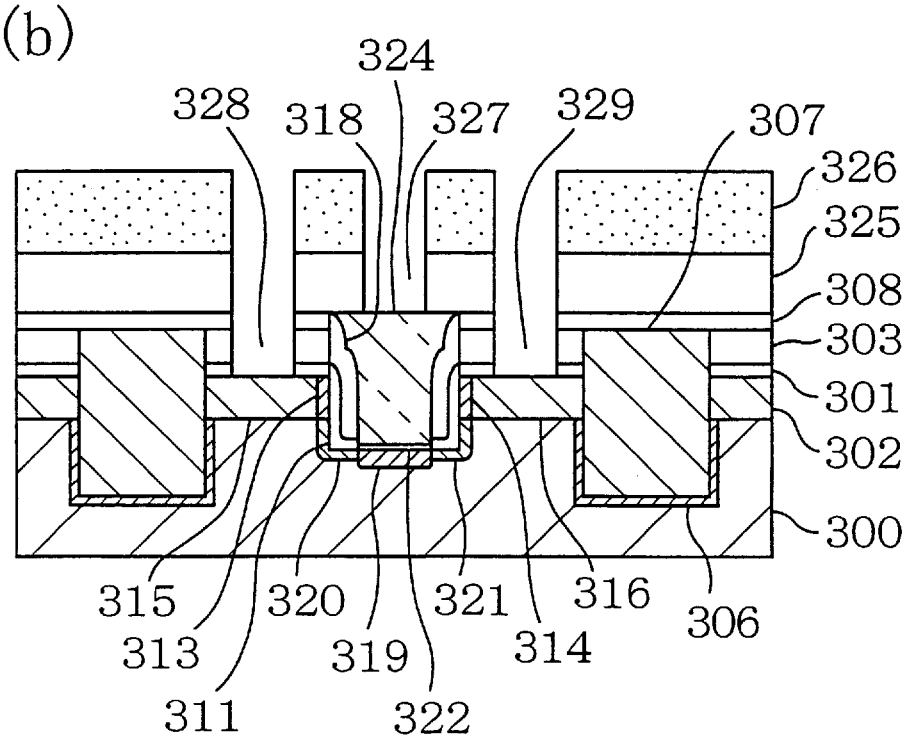

Thereafter, as shown in FIG. 19(b), a third resist pattern 326 is defined by photolithography on the sixth insulating film 325 so as to have a plurality of openings over respective regions where contact holes are to be formed. Then, using the third resist pattern 326 as a mask, the sixth, third, second and first insulating films 325, 308, 303 and 301 are etched, thereby forming gate, source and drain contact holes 327, 328 and 329.

Figure 20A:
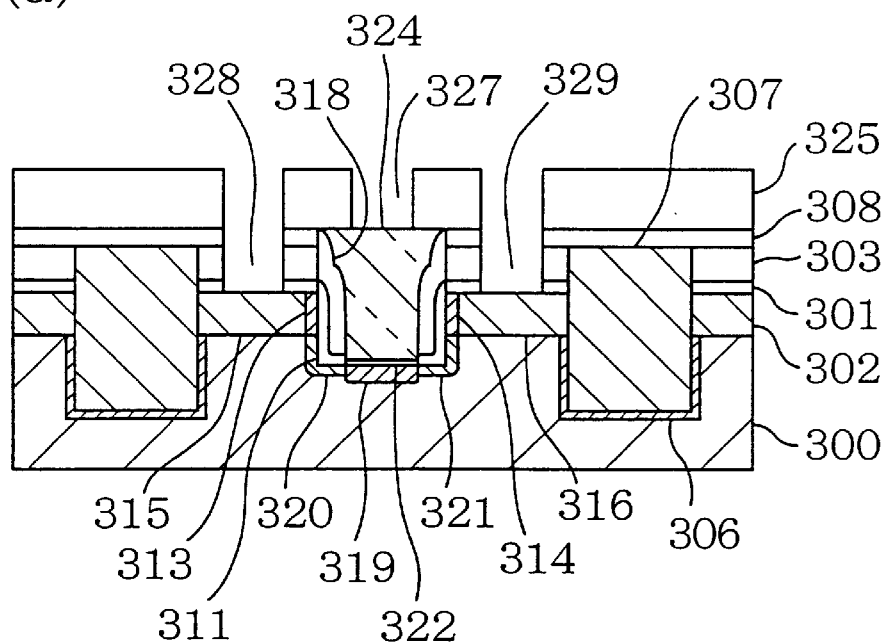
FIGS. 20(a) and 20(b) are cross-sectional views illustrating respective process steps for fabricating a semiconductor device according to the third embodiment.

Next, as shown in FIG. 20(a), the third resist pattern 326 is removed.

Figure 20B:
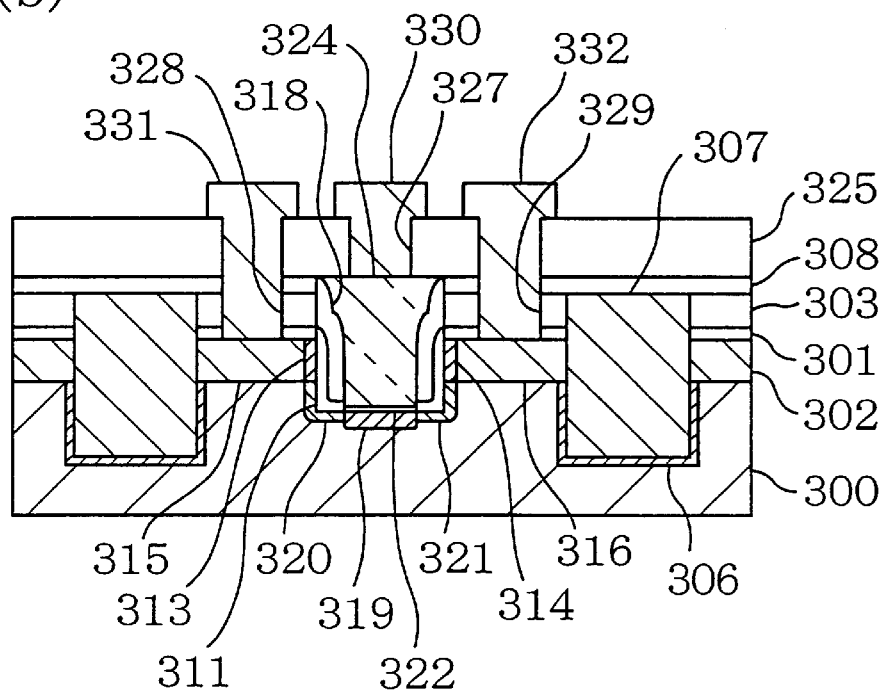

Finally, as shown in FIG. 20(b), metal interconnection layers 330, 331 and 332 are formed by stacking titanium nitride, aluminum, tungsten, titanium nitride and titanium films, for example, to fill in the gate, source and drain contact holes 327, 328 and 329 and to slightly protrude upward therefrom. The metal interconnection layers 330, 331 and 332 will be used as extension electrodes.

According to the third embodiment, the gate insulating film 322 is formed on the surface of the p-type silicon substrate 300, which is exposed inside the recess 310 provided for the p-type silicon substrate 300. Thereafter, the gate electrode 324 is formed by filling in the recess 310 with the conductive film 323. That is to say, since the gate electrode 324 can be formed without using the gate insulating film 322 as an etch stopper, it is possible to prevent the gate insulating film 322 from being damaged during the formation of the gate electrode 324. Accordingly, the thickness of the gate insulating film 322 can be reduced without sacrificing the reliability of the gate insulating film 322, and therefore, the number of semiconductor devices integrated can be increased. In addition, even when the gate insulating film 322 is thinned, the gate electrode 324 still can be formed at a high aspect ratio, and the resistance of the gate electrode 324 can be reduced. Consequently, the semiconductor device can operate at a higher speed.

Also, according to the third embodiment, the recess 310 is formed to have its bottom located under the n-type doped layer 302. Thus, source/drain regions 315, 316 are formed out of the n-type doped layer 302, which has been divided into two by the recess 310. Accordingly, the formation of a channel can be controlled by applying a voltage to the gate electrode 324 to be formed within the recess 310, thus improving the reliability of the semiconductor device.

In addition, according to the third embodiment, the conductive film 323 is deposited over the entire surface of the third insulating film 308, as well as inside the recess 310. Thereafter, portions of the conductive film 323 that have been deposited on the third insulating film 308 are removed, thereby forming the gate electrode 324 such that the respective upper surfaces of the gate electrode 324 and third insulating film 308 are substantially flush with each other and planarized. Thus, the upper surface of the third insulating film 308, which will be an underlying layer in a subsequent process step, can be planarized when the gate electrode 324 is formed. Accordingly, upper-level interconnects or devices can be formed on the third insulating film 308, as well as on the gate electrode 324, without newly performing a planarization process step. As a result, a multilevel structure can be formed for the semiconductor device more easily.

Moreover, according to the third embodiment, the recess 310 is formed to have its bottom located under the n-type doped layer 302, i.e., under the surface of the p-type silicon substrate 300. Thus, the bottom of the gate electrode 324 can be located under the surface of the p-type silicon substrate 300. Therefore, the aspect ratio of the source/drain contact holes 328 and 329 can be lower compared to forming the entire gate electrode with the same thickness as that of the gate electrode 324 above the surface of the semiconductor substrate. Accordingly, the respective process steps of forming the source/drain contact holes 328 and 329 and filling in the contact holes with a conductive material can be performed with a lot more certainty, thus improving the reliability of the semiconductor device.

Hereinafter, it will be described with reference to FIGS. 21(a) and 21(b) how the aspect ratio of source/drain contact holes differs depending on whether a gate electrode with the same thickness is formed by the conventional method or the method according to the third embodiment of the present invention.

Figure 21A:
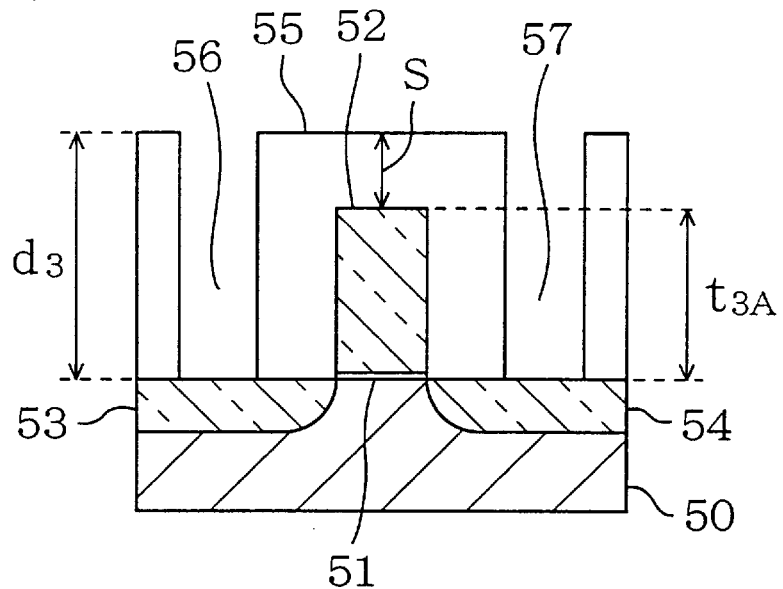
FIG. 21(a) is a cross-sectional view illustrating a structure of a semiconductor device fabricated by a conventional method as a third comparative example.
Figure 21B:
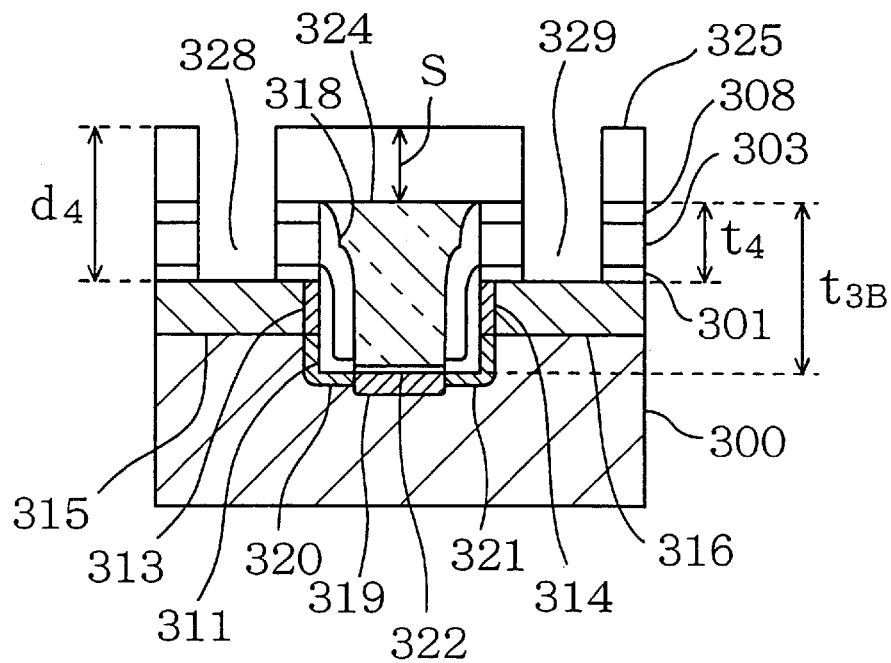
FIG. 21(b) is a cross-sectional view illustrating the structure of the semiconductor device fabricated by the method according to the third embodiment.

FIG. 21(a) illustrates a cross-sectional structure of a semiconductor device fabricated by a conventional method as a third comparative example, and FIG. 21(b) illustrates a cross-sectional structure of a semiconductor device fabricated by the method according to the third embodiment of the present invention. In FIG. 21(b), the same components as those illustrated in the cross-sectional view of FIG. 20(a) showing a process step according to the third embodiment are identified by the same reference numerals, and the description thereof will be omitted herein.

In FIG. 21(a), a silicon substrate is identified by 50, gate insulating film 51, gate electrode 52, source region 53, drain region 54, insulating film 55, source contact hole 56, and drain contact hole 57. In the example illustrated in FIG. 21(a), the gate electrode 52 is formed entirely above the surface of the silicon substrate 50, i.e., above the surface of the source/drain regions 53 and 54.

Also, in FIG. 21(a), $t_{3A}$ represents a distance between the surface of the silicon substrate 50 and the top of the gate electrode 52. $d_3$ represents the depth of the source/drain contact holes 56 and 57. And S represents the thickness of a portion of the insulating film 55 located over the gate electrode 52. In this case, $d_3=t_{3A}+S$.

Supposing the respective thicknesses of the gate insulating film 51 and gate electrode 52 are identified by $t_{GO}$ and $t_{GE}$ although not shown in FIG. 21(a), $t_{3A}=t_{GO}+t_{GE}$.

In FIG. 21(b) on the other hand, $t_{3B}$ represents a distance between the surface of the second p-type doped layer 319 and the top of the gate electrode 324. $t_4$ represents a distance between the surface of the p-type silicon substrate 300, i.e., the surface of the source/drain regions 315 and 316, and the top of the gate electrode 324. $d_4$ represents the depth of the source/drain contact holes 328 and 329. And S represents the thickness of the sixth insulating film 325 located over the gate electrode 324, which is equal to the thickness S shown in FIG. 21(a). The opening width of the source/drain contact holes 328 and 329 is supposed to be equal to that of the source/drain contact holes 56 and 57 shown in FIG. 21(a).

Supposing the respective thicknesses of the gate insulating film 322 and gate electrode 324 are identified by $t_{GO}$ and $t_{GE}$ (which are equal to the thicknesses $t_{GO}$ and $t_{GE}$ as in the example shown in FIG. 21(a)) although not shown in FIG. 21(b), $t_{3B}=t_{GO}+t_{GE}=t_{3A}$.

Thus, as shown in FIG. 21(b), the depth $d_4$ of the source/drain contact holes 328 and 329 is equal to the sum of $t_4$ and S. On the other hand, since $t_4<t_{3B}=t_{3A}$, $d_4<d_3$.

As described above, if gate electrodes with the same thickness are formed by the conventional method and the method according to the third embodiment of the present invention, respectively, the aspect ratio of the source/drain contact hole attained by the method according to the third embodiment can be lower.

Also, according to the third embodiment, the bottom of the gate electrode 324 can be located under the surface of the p-type silicon substrate 300. Thus, compared to forming source/drain contact holes with the same depth and same aspect ratio as those of the source/drain contact holes 328 and 329 and yet forming the entire gate electrode above the surface of a semiconductor substrate, the gate electrode 324 can be thicker. As a result, the resistance of the gate electrode 324 can be reduced and the semiconductor device can operate at a higher speed.

Hereinafter, it will be described with reference to FIGS. 22(a) and 22(b) how the thickness of a gate electrode differs depending on whether source/drain contact holes with the same depth and same aspect ratio are formed by the conventional method or the method according to the third embodiment of the present invention.

Figure 22A:
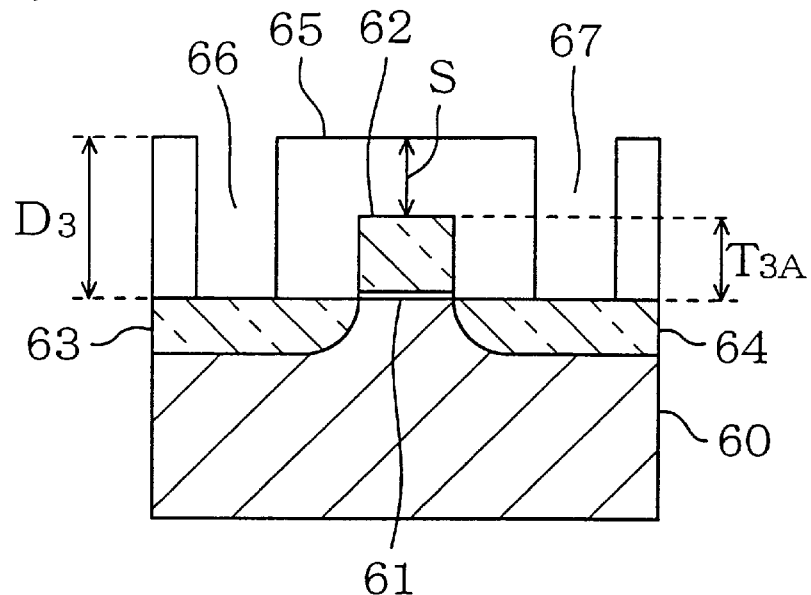
FIG. 22(a) is a cross-sectional view illustrating the structure of the semiconductor device fabricated by the conventional method as a fourth comparative example.
Figure 22B:
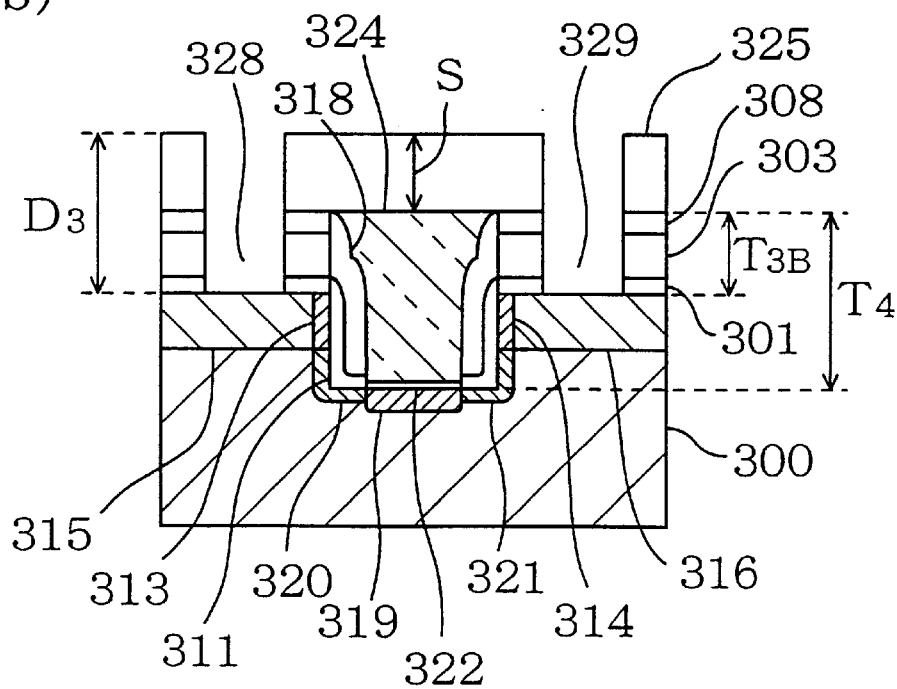
FIG. 22(b) is a cross-sectional view illustrating the structure of the semiconductor device fabricated by the method according to the third embodiment.
Figure 23A:
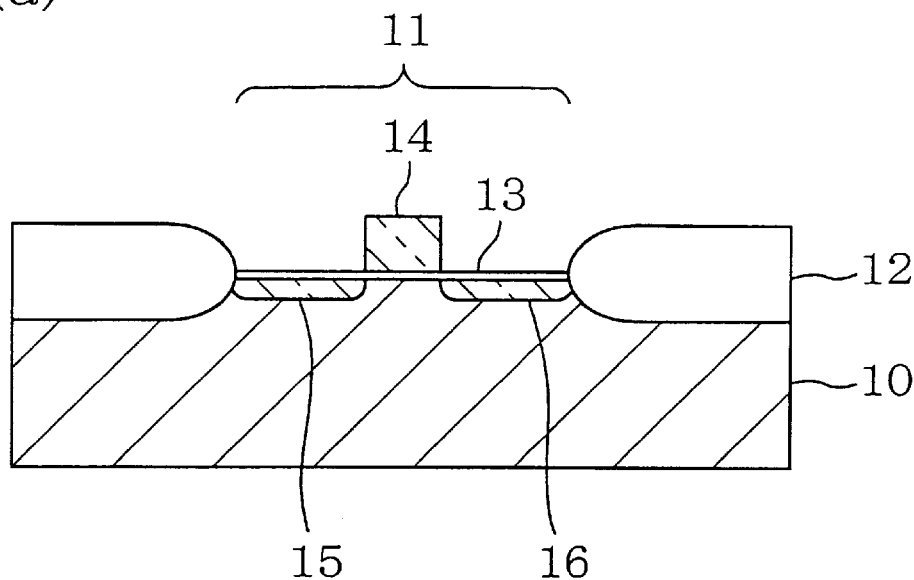
FIGS. 23(a) and 23(b) are cross-sectional views illustrating conventional process steps for fabricating a semiconductor device.
Figure 23B:
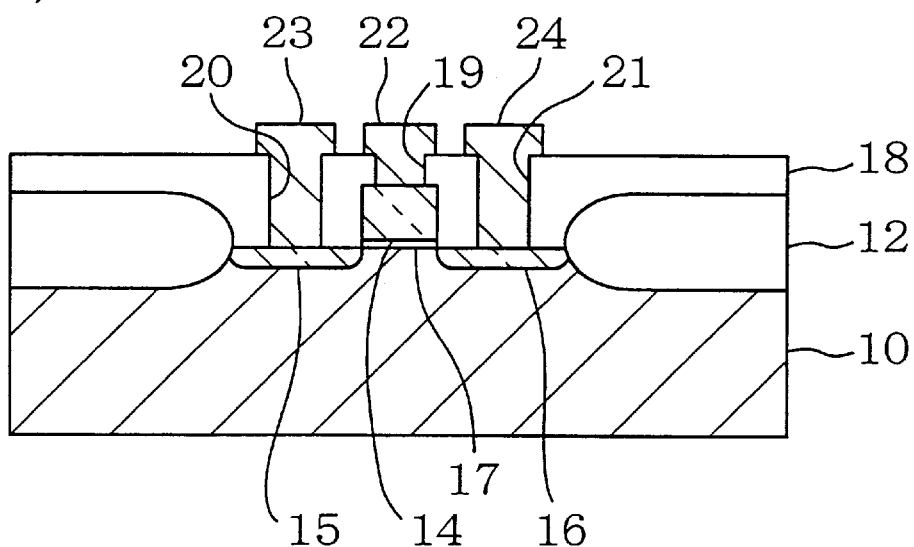

FIG. 22(a) illustrates a cross-sectional structure of a semiconductor device fabricated by a conventional method as a fourth comparative example, and FIG. 22(b) illustrates a cross-sectional structure of a semiconductor device fabricated by the method according to the third embodiment of the present invention. In FIG. 22(b), the same components as those illustrated in the cross-sectional view of FIG. 20(a) showing a process step according to the third embodiment are identified by the same reference numerals, and the description thereof will be omitted herein.

In FIG. 22(a), a silicon substrate is identified by 60, gate insulating film 61, gate electrode 62, source region 63, drain region 64, insulating film 65, source contact hole 66, and drain contact hole 67. In the example illustrated in FIG. 22(a), the gate electrode 62 is formed entirely above the surface of the silicon substrate 60, i.e., above the surface of the source/drain regions 63 and 64.

Also, in FIG. 22(a), $T_{3A}$ represents a distance between the surface of the silicon substrate 60 and the top of the gate electrode 62. $D_3$ represents the depth of the source/drain contact holes 66 and 67. And S represents the thickness of a portion of the insulating film 65 located over the gate electrode 62. In this case, $T_{3A}=D_3-S$.

Supposing the thickness of the gate insulating film 61 is identified by $t_{GO}$ although not shown in FIG. 22(a), the thickness $T_{GE1}$ of the gate electrode 62 is $T_{3A}-t_{GO}$.

In FIG. 22(b) on the other hand, $T_{3B}$ represents a distance between the surface of the p-type silicon substrate 300, i.e., the surface of the source/drain regions 315 and 316, and the top of the gate electrode 324. $T_4$ represents a distance between the surface of the second p-type doped layer 319 and the top of the gate electrode 324. $D_3$ represents the depth of the source/drain contact holes 328 and 329, which is equal to the depth $D_3$ shown in FIG. 22(a). And S represents the thickness of the sixth insulating film 325 located over the gate electrode 324, which is equal to the thickness S shown in FIG. 22(a). The opening width of the source/drain contact holes 328 and 329 is supposed to be equal to that of the source/drain contact holes 66 and 67 shown in FIG. 22(a).

Supposing the thickness of the gate insulating film 322 is identified by $t_{GO}$ (which is equal to the thickness $t_{GO}$ as in the example shown in FIG. 22(a)) although not shown in FIG. 22(b), the thickness $T_{GE2}$ of the gate electrode 324 is $T_4$–$t_{GO}$.

Thus, as shown in FIG. 22(b), $T_{3B}=D_3$–S. On the other hand, since $T_4>T_{3B}=T_{3A}=D_3$–S, $T_{GE2}>T_{GE1}$.

As described above, if source/drain contact holes with the same depth and same aspect ratio are formed by the conventional method and the method according to the third embodiment of the present invention, respectively, the gate electrode formed by the method according to the third embodiment can be thicker.

In addition, according to the third embodiment, the sidewall 318 is formed on the wall of the recess 310. Accordingly, the source/drain regions 315 and 316 can be insulated from the gate electrode 324 with more certainty, thus improving the reliability of the semiconductor device.

Moreover, according to the third embodiment, the n-type lightly-doped layer 312 is formed to be connected to the n-type doped layer 302, i.e., the source/drain regions 315 and 316, within the surface region of the p-type silicon substrate 300 inside the recess 310. Thereafter, the second p-type doped layer 319 is formed so as to divide the n-type lightly-doped layer 312 into two. Since the n-type lightly-doped layer 312 is divided into two by the second p-type doped layer 319, first and second n-type lightly-doped regions 320 and 321 are formed between the source/drain regions 315 and 316 and the second p-type doped layer 319, respectively. Accordingly, the intensity of an electric field, which is created by applying a voltage between the source/drain regions 315 and 316, can be reduced, thus improving the reliability of the semiconductor device.

Furthermore, according to the third embodiment, the third insulating film 308 is deposited to such a thickness that the film 308 is not completely removed by anisotropic etching to be performed on the fifth insulating film 317. Thus, when the fifth insulating film 317 is etched anisotropically, the third insulating film 308 is not removed completely, and therefore the trench isolations 307 are not damaged, either. As a result, the reliability of the semiconductor device improves.

Moreover, according to the third embodiment, the third and fifth insulating films 308 and 317 both show etch selectivity with respect to the fourth insulating film 311. Thus, when the fourth insulating film 311 is etched, neither the third insulating film 308 nor the sidewall 318 made of the fifth insulating film 317 is removed, and the recess 310 is not damaged. As a result, the gate electrode 324 can be formed exactly at its desired size, thus improving the reliability of the semiconductor device.

In the third embodiment, the conductive film 323 is made of doped polysilicon. Alternatively, the conductive film 323 may be a single-layer film of tungsten, molybdenum, titanium, platinum, copper, tungsten silicide, molybdenum silicide, titanium silicide or platinum silicide, or a multilayer film consisting of a doped polysilicon film and a tungsten silicide, molybdenum silicide, titanium silicide or platinum silicide film.

Also, in the third embodiment, an n-channel MOS transistor is formed using the p-type silicon substrate 300. However, the same effects are attainable if a p-channel MOS transistor is formed using an n-type silicon substrate instead.

What is claimed is:

1. A method of fabricating a semiconductor device, comprising the steps of:
   a) forming a doped layer of a first conductivity type within an entire surface of a semiconductor substrate;
   b) depositing an insulating film on the semiconductor substrate after formation of the doped layer of the first conductivity type in the step a), thereafter removing a portion of the insulating film located in a first region where a trench isolation is to be formed, and, then forming the trench isolation in the semiconductor substrate in the first region such that the trench isolation has a bottom lower than that of the doped layer of the first conductivity type;
   c) removing at least the insulating film in a second region where a gate electrode is to be formed, to form a recess in the insulating film, after formation of the trench isolation in the step (b);
   d) forming a gate insulating film on the surface of the semiconductor substrate, which is exposed inside the recess;
   e) forming the gate electrode on the gate insulating film by filling in the recess formed in the insulating film with a conductive film; and
   f) forming a contact hole which leads to the doped layer of the first conductivity type, passing through a portion of the insulating film in which portion the gate electrode is not formed, and subsequently forming an extension electrode for the doped layer of the first conductivity type in the contact hole.

2. The method of claim 1, further comprising, between the steps c) and d), the steps of
   g) forming a doped layer of a second conductivity type in a region under the bottom of the recess such that the doped layer of the first conductivity type is divided into two by the doped layer of the second conductivity type.

3. The method of claim 1, wherein the step e) comprises the steps of:
   depositing the conductive film over the insulating film, as well as inside the recess; and
   removing portions of the conductive film that have been deposited on the insulating film, thereby forming the gate electrode such that the upper surfaces of the gate electrode and the insulating film are substantially flush with each other and planarized.

4. The method of claim 1, wherein the step c) comprises the step of forming the recess such that the bottom of the recess is located within the doped layer of the first conductivity type, and
   wherein the method further comprises, between the steps c) and d), the step of
   g) forming a doped layer of a second conductivity type in a region under the bottom of the recess such that the doped layer of the first conductivity type is divided into two by the doped layer of the second conductivity type.

5. The method of claim 4, further comprising, between the steps c) and d), the step of
   h) forming an insulating sidewall on the wall of the recess.

6. The method of claim 5, further comprising, between the steps c) and h), the step of i) forming a lightly-doped layer of the first conductivity type within a surface region of the semiconductor substrate inside the recess, a dopant concentration of the lightly-doped layer of the first conductivity type being lower than that of the doped layer of the first conductivity type, wherein the doped layer of the second conductivity type is formed between the steps h) and d) in a region under a part of the bottom of the recess, which is surrounded by the sidewall, so as to divide the lightly-doped layer of the first conductivity type into two.

7. The method of claim 1, wherein the step c) comprises the step of forming the recess such that the bottom of the recess is located under the doped layer of the first conductivity type.

8. The method of claim 7, further comprising, between the steps c) and d), the step of h) forming an insulating sidewall on the wall of the recess.

9. The method of claim 7, further comprising, between the steps c) and d), the steps of:

j) forming a lightly-doped layer of the first conductivity type to be connected to the doped layer of the first conductivity type within a surface region of the semiconductor substrate inside the recess, a dopant concentration of the lightly-doped layer of the first conductivity type being lower than that of the doped layer of the first conductivity type; and k) forming a doped layer of the second conductivity type such that the lightly-doped layer of the first conductivity type is divided into two by the doped layer of the second conductivity type.

10. The method of claim 1, wherein the step l) comprises the steps of:

forming a trench in the semiconductor substrate by performing etching on the semiconductor substrate and the insulating film in the first region where the trench isolation is to be formed;

depositing a silicon dioxide film over the insulating film as well as the trench; and removing a portion of the silicon dioxide deposited on the insulating film such that upper surfaces of the trench isolation and the insulating film are substantially flush with each other and planarized.

11. The method of claim 1, further comprises between the steps e) and f), the step of depositing an interlayer insulating film over the insulating film as well as the gate electrode, wherein the step f) comprises the steps of:

forming first and second contact holes by performing etching on the insulating film and the interlayer insulating film, the first contact hole passing through the interlayer insulating film and the insulating film and leading to the doped layer of the first conductivity type and the second contact hole passing through the interlayer insulating film and leading to the gate electrode; and forming an extension electrode for the doped layer of the first conductivity type in the first contact hole and forming an extension electrode for the gate electrode in the second contact hole.

* * * * *